US012727178B2

(12) United States Patent
Long et al.

(10) Patent No.: US 12,727,178 B2
(45) Date of Patent: Sep. 1, 2026

(54) SEMICONDUCTOR RECTIFIER

(71) Applicant: Diodes Incorporated, Plano, TX (US)

(72) Inventors: Tao Long, Shanghai (CN); Ze Rui Chen, Plano, TX (US); Pin-Hao Huang, New Taipei City (TW); Paul Keith Gurry, Chadderton (GB); Li-Hsien Chou, New Taipei City (TW)

(73) Assignee: DIODES INCORPORATED, Plano, TX (US)

( * ) Notice: Subject to any disclaimer, the term of this patent is extended or adjusted under 35 U.S.C. 154(b) by 272 days.

(21) Appl. No.: 18/777,283

(22) Filed: Jul. 18, 2024

(65) Prior Publication Data

US 2025/0015199 A1 Jan. 9, 2025

Related U.S. Application Data

(62) Division of application No. 18/614,439, filed on Mar. 22, 2024, now Pat. No. 12,170,340.

(30) Foreign Application Priority Data

Jul. 3, 2023 (CN) ........................ 202310809114.X

(51) Int. Cl.
*H10D 1/40* (2025.01)
*H10D 62/10* (2025.01)
(Continued)

(52) U.S. Cl.
CPC ............. *H10D 1/40* (2025.01); *H10D 62/124* (2025.01); *H10D 62/8325* (2025.01);
(Continued)

(58) Field of Classification Search
CPC .... H10D 1/40; H10D 62/124; H10D 62/8325; H10D 64/512; H10D 84/0123;
(Continued)

(56) References Cited

U.S. PATENT DOCUMENTS 5,510,281 A 4/1996 Ghezzo et al.
6,781,194 B2 * 8/2004 Baliga ................ H10D 30/0295 257/E29.066
(Continued)

FOREIGN PATENT DOCUMENTS

CN 101226883 A 7/2008
CN 102543749 A 7/2012
(Continued)

OTHER PUBLICATIONS

International Search Report and Written Opinion for Application No. PCT/CN2023/138407, mailed on Mar. 12, 2024, 7 pages.
(Continued)

*Primary Examiner* — Maliheh Malek
(74) *Attorney, Agent, or Firm* — Kilpatrick Townsend & Stockton LLP

(57) ABSTRACT

A semiconductor rectifier device comprises: an epitaxial layer having a top surface and a bottom surface; a first trench comprising a first side wall, a second side wall, and a first bottom surface; a second trench adjacent to the first trench, the second trench comprising a third side wall, a fourth side wall, and a second bottom surface; a first doped region abutting against the first side wall and at least a part of the first bottom surface of the first trench; a second doped region adjacent to and separated from the first doped region, wherein the second doped region abuts against the third side wall, the fourth side wall and the second bottom surface of the second trench; a gate structure disposed on the top surface between the first trench and the second trench; and a contact metal layer disposed on the top surface of the epitaxial layer.

9 Claims, 30 Drawing Sheets

(51) Int. Cl.
*H10D 62/832* (2025.01)
*H10D 64/27* (2025.01)
*H10D 84/01* (2026.01)
*H10D 84/03* (2025.01)
*H10P 50/00* (2026.01)
*H10W 20/00* (2026.01)

(52) U.S. Cl.
CPC ....... *H10D 64/512* (2025.01); *H10D 84/0123* (2025.01); *H10D 84/0126* (2025.01); *H10D 84/038* (2025.01); *H10P 50/691* (2026.01); *H10W 20/076* (2026.01); *H10D 84/0135* (2025.01)

(58) Field of Classification Search
CPC ............. H10D 84/0126; H10D 84/038; H10D 84/0135; H10D 8/00; H10D 8/051; H10D 62/117; H10D 64/23; H10P 50/691; H10P 30/22; H10P 95/90; H10W 20/076; H10W 74/01; H01L 29/86; H01L 21/308; H01L 21/76831; H01L 29/0684; H01L 29/42356; H01L 29/1608; H01L 21/70; H01L 21/77; H01L 21/8232–8234; H01L 21/823437–823462
See application file for complete search history.

(56) References Cited

U.S. PATENT DOCUMENTS

| | | | | |
|---|---|---|---|---|
| 7,078,781 | B2 | 7/2006 | Hatakeyama et al. | |
| 7,126,188 | B2 * | 10/2006 | Shone | H10B 41/27 257/330 |
| 7,282,739 | B2 | 10/2007 | Kaneko | |
| 7,829,946 | B2 * | 11/2010 | Shirai | H10D 30/655 257/341 |
| 7,838,922 | B2 * | 11/2010 | Li | B82Y 10/00 257/319 |
| 8,193,572 | B2 * | 6/2012 | Li | H10B 41/27 257/E29.264 |
| 9,530,770 | B2 * | 12/2016 | Romanescu | H10D 1/474 |
| 9,680,010 | B1 * | 6/2017 | Hsiao | H10D 30/0221 |
| 11,069,803 | B2 * | 7/2021 | Tanaka | H10D 12/031 |
| 11,355,592 | B2 * | 6/2022 | Kyogoku | H10D 30/0297 |
| 12,170,340 | B1 * | 12/2024 | Long | H10D 1/40 |
| 2003/0227061 | A1 | 12/2003 | Yokogawa et al. | |
| 2005/0275002 | A1 * | 12/2005 | Shone | H10B 41/27 257/296 |
| 2006/0273384 | A1 * | 12/2006 | Hshieh | H10D 30/0295 257/334 |
| 2007/0238249 | A1 * | 10/2007 | Swift | B82Y 10/00 257/E21.422 |
| 2008/0173921 | A1 * | 7/2008 | Li | B82Y 10/00 257/E21.409 |
| 2008/0315211 | A1 | 12/2008 | Ichikawa et al. | |
| 2009/0200608 | A1 * | 8/2009 | Shirai | H10D 30/655 257/334 |
| 2011/0024802 | A1 * | 2/2011 | Shirai | H10D 30/655 257/334 |
| 2011/0260174 | A1 * | 10/2011 | Hebert | H10D 30/015 257/77 |
| 2013/0214378 | A1 * | 8/2013 | Shirai | H10D 30/655 257/476 |
| 2014/0110723 | A1 * | 4/2014 | Ikegami | H10D 12/031 257/77 |
| 2014/0361349 | A1 * | 12/2014 | Alexandrov | H10D 30/0515 438/192 |
| 2015/0236119 | A1 * | 8/2015 | Tanaka | H10D 12/031 257/77 |
| 2015/0270354 | A1 | 9/2015 | Shimizu et al. | |
| 2015/0318213 | A1 * | 11/2015 | Tsai | B82Y 10/00 438/268 |
| 2015/0318214 | A1 * | 11/2015 | Tsai | B82Y 10/00 438/268 |
| 2017/0125575 | A1 | 5/2017 | Ohoka et al. | |
| 2017/0236899 | A1 * | 8/2017 | Hsiao | H10D 30/0221 438/275 |
| 2017/0278930 | A1 * | 9/2017 | Ruhl | H10D 62/117 |
| 2017/0352723 | A1 * | 12/2017 | Ma | H10D 12/038 |
| 2019/0027568 | A1 * | 1/2019 | Gao | H10D 12/031 |
| 2019/0198622 | A1 * | 6/2019 | Uchida | H10D 12/031 |
| 2020/0083369 | A1 * | 3/2020 | Kobayashi | H10D 12/031 |
| 2020/0119140 | A1 | 4/2020 | Li et al. | |
| 2021/0083100 | A1 * | 3/2021 | Tanaka | H10D 12/031 |
| 2021/0296447 | A1 * | 9/2021 | Kyogoku | H10D 30/0297 |
| 2022/0037311 | A1 * | 2/2022 | Blair | H10D 62/126 |
| 2022/0093768 | A1 | 3/2022 | Wang et al. | |
| 2022/0320295 | A1 * | 10/2022 | Ngwendson | H10D 12/031 |
| 2023/0197773 | A1 * | 6/2023 | Fang | H10D 12/032 257/139 |
| 2023/0197786 | A1 * | 6/2023 | Mori | H10D 12/031 257/77 |
| 2023/0246077 | A1 * | 8/2023 | Baba | H10D 30/668 257/77 |
| 2023/0395664 | A1 * | 12/2023 | Saitoh | H10D 12/031 |
| 2024/0128381 | A1 * | 4/2024 | Tseng | H10D 8/422 |
| 2024/0222473 | A1 * | 7/2024 | Lin | H10D 30/021 |
| 2024/0355872 | A1 * | 10/2024 | Cooper | H10D 12/031 |
| 2025/0015199 | A1 * | 1/2025 | Long | H10D 1/40 |
| 2025/0133802 | A1 * | 4/2025 | Fu | H10D 30/025 |
| 2026/0101546 | A1 * | 4/2026 | Han | H10D 62/109 |

FOREIGN PATENT DOCUMENTS

| | | | |
|---|---|---|---|
| CN | 103208509 | A | 7/2013 |
| CN | 113299732 | A | 8/2021 |
| CN | 114512544 | A | 5/2022 |
| CN | 116235279 | A | 6/2023 |
| JP | 2020061547 | A | 4/2020 |
| TW | 200428644 | A | 12/2004 |
| TW | 201133835 | A | 10/2011 |
| TW | 201929058 | A | 7/2019 |
| TW | 202320180 | A | 5/2023 |
| WO | 2022047349 | A2 | 3/2022 |

OTHER PUBLICATIONS

Extended European Search Report for European Application No. 24183700.4, mailed Nov. 12, 2024, 11 pages.

Office Action and Search Report for Taiwan Patent Application No. 112142412, mailed Feb. 5, 2025, 11 pages.

Office Action and Search Report for Taiwan Patent Application No. 112142412, mailed Oct. 23, 2024, 9 pages.

Office Action for Japanese Patent Application No. 2024-085386, mailed on Apr. 18, 2025, 31 pages.

* cited by examiner

SEMICONDUCTOR RECTIFIER

CROSS-REFERENCES TO RELATED APPLICATIONS

This application is a divisional application of U.S. patent application Ser. No. 18/614,439, filed Mar. 22, 2024, and entitled "SEMICONDUCTOR RECTIFIER AND MANUFACTURING METHOD OF THE SAME", which claims priority to Chinese patent application No. 202310809114.X, filed on Jul. 3, 2023, and entitled "SEMICONDUCTOR RECTIFIER AND MANUFACTURING METHOD", the disclosure of which are hereby incorporated by reference in their entirety.

TECHNICAL FIELD

The present invention relates to the structure of a semiconductor rectifier device and a manufacturing method therefor, and more specifically relates to a structure having a semiconductor rectifier device formed on silicon carbide and a manufacturing method therefor.

BACKGROUND

It is well known that semiconductor materials have wide bandgaps (e.g., a bandgap energy value Eg of greater than 1.1 eV), low on-resistance (RON), high thermal conductivity, high operating frequency and high carrier (e.g., charges or holes) saturation velocity, and are very suitable for producing electronic components such as diodes or transistors, particularly for use in power supply applications. One example of the materials having the described features and designed for manufacturing electronic components is silicon carbide (SiC). In particular, silicon carbide, in its different polymorphs (e.g., 3C—SiC, 4H—SiC and 6H—SiC), is superior to silicon in terms of the aforementioned properties.

Compared with similar devices on a silicon substrate, an electronic device on a silicon carbide substrate has many advantages, such as low on-state output resistance, low leakage current, high operating temperature, and high operating frequency. Semiconductor structures based on silicon carbide substrates require high-temperature (e.g. 1700° C. or above) annealing processes for activation. However, polysilicon and commonly used gate materials cannot withstand such high-temperature annealing processes, resulting in process integration difficulties and an increase in overall process costs.

SUMMARY

Embodiments of the present disclosure relate to a semiconductor rectifier device. The semiconductor rectifier device includes an epitaxial layer having a top surface and a bottom surface that are opposite to each other. The semiconductor rectifier device also includes a first trench extending from the top surface to the bottom surface, the first trench may include a first side wall, a second side wall opposite to the first side wall, and a first bottom surface connecting the first side wall and the second side wall. The semiconductor rectifier device also includes a second trench extending from the top surface to the bottom surface and being adjacent to the first trench, and the second trench may include a third side wall, a fourth side wall opposite to the third side wall, and a second bottom surface connecting the third side wall and the fourth side wall. The semiconductor rectifier device also includes a first doped region extending from the top surface to the bottom surface and abutting against the first side wall and at least a part of the first bottom surface of the first trench. The semiconductor rectifier device also includes a second doped region adjacent to and separated from the first doped region, where the second doped region extends from the top surface to the bottom surface, and abuts against the third side wall, the fourth side wall and the second bottom surface of the second trench. The semiconductor rectifier device also includes a gate structure disposed on the top surface between the first trench and the second trench, where a bottom surface of the gate structure abuts against the first doped region and the second doped region. The device also includes a contact metal layer disposed on the top surface of the epitaxial layer along the first trench, the gate structure, and the second trench.

Implementations may include one or more of the following features. In some embodiments, the gate structure may include a fifth side wall and a sixth side wall opposite to the fifth side wall, where the fifth side wall is aligned with the second side wall of the first trench when viewed from a cross-sectional view, and the sixth side wall of the gate structure is aligned with the third side wall of the second trench when viewed from the cross-sectional view. In some embodiments, the first side wall of the first trench is connected to a first part of the top surface, a part of the top surface between the first trench and the second trench is a second part of the top surface, and the first part and the second part are located at an approximately same horizontal height. In some embodiments, the first side wall of the first trench is connected to a first part of the top surface, a part of the top surface between the first trench and the second trench is a second part of the top surface, and the first part has a first horizontal height, the second part has a second horizontal height lower than the first horizontal height.

In some embodiments, the semiconductor rectifier device may include: a third doped region extending from the top surface to the bottom surface and overlapping with at least a part of the first doped region, and the third doped region has a depth greater than a depth of the first doped region. In some embodiments, a part of the third doped region close to the first doped region has a higher doping concentration. In some embodiments, the contact metal layer is in contact with the second side wall of the first trench, the bottom surface of the first trench, the third side wall and the fourth side wall of the second trench, and the bottom surface of the second trench. In some embodiments, the first doped region further abuts against the first side wall of the first trench. In some embodiments, a first height of the first side wall of the first trench is greater than a second height of the second side wall of the first trench, a third height of the third side wall of the second trench is approximately equal to a fourth height of the fourth side wall of the second trench, and the second height, the third height, and the fourth height are approximately equal.

Embodiments of the present disclosure relate to a manufacturing method for a semiconductor rectifier device. The method comprises: forming a patterned layer on a silicon carbide layer; etching the silicon carbide layer using the patterned layer as a mask, to form a first trench and a second trench adjacent to the first trench; performing ion implantation on the silicon carbide layer using the patterned layer as the mask; annealing the silicon carbide layer; and after the annealing, forming a gate structure on the silicon carbide layer between the first trench and the second trench, wherein the gate structure has a first side wall and a second side wall opposite to the first side wall, the first side wall and a side wall of the first trench are continuous, and the second side wall and a side wall of the second trench are continuous.

Implementations may include one or more of the following features. In some embodiments, the manufacturing method may include: before the annealing, forming a carbon-containing layer to cover the silicon carbide layer, and after the annealing, removing the carbon-containing layer. In some embodiments, the manufacturing method may include: forming a first dielectric layer to fill the first trench and the second trench, wherein a top surface of the first dielectric layer is horizontally aligned with a top surface of the silicon carbide layer; removing an exposed part of the silicon carbide layer adjacent to the top surface of the silicon carbide layer to form a first surface lower than the top surface of the silicon carbide layer, wherein the first surface is higher than a bottom surface of the first trench; and forming the gate structure on the first surface. In some embodiments, forming the gate structure on the first surface may include: forming a second dielectric layer on the first surface; and forming a gate electrode layer on the second dielectric layer, where a top surface of the gate electrode layer is horizontally aligned with the top surface of the first dielectric layer.

In some embodiments, a vertical distance between the first surface and the top surface of the silicon carbide layer is between 1500 and 2000 angstroms. In some embodiments, the manufacturing method may include: before forming the patterned layer, forming a terminal doped region in the silicon carbide layer. In some embodiments, the patterned layer exposes a part of the terminal doped region, and the terminal doped region abuts against the first trench. In some embodiments, the patterned layer may include an opening used to define the first trench, and when viewed from a cross-sectional view, the opening overlaps with a part of the terminal doped region in a vertical direction. In some embodiments, the patterned layer may include an opening used to define the first trench, and when viewed from a cross-sectional view, the opening is located within a coverage range of a projection of the terminal doped region in a vertical direction. In some embodiments, the manufacturing method may include: before forming the gate structure on the silicon carbide layer between the first trench and the second trench, forming a third dielectric layer to cover the terminal doped region and a part of the first trench adjacent to the terminal doped region.

In some embodiments, the manufacturing method may include: conformally forming a contact metal layer on the silicon carbide layer and the gate structure, wherein the contact metal layer is in contact with the side wall and a bottom surface of the first trench, and is in contact with the side wall and a bottom surface of the second trench; forming a first electrode layer on the contact metal layer; and forming a second electrode layer below the silicon carbide layer, wherein the first electrode layer and the second electrode layer are located on opposite sides of the silicon carbide layer. In some embodiments, the second electrode layer is in contact with the substrate. In some embodiments, the first trench or the second trench has a depth of between 4000 and 5000 angstroms. In some embodiments, the ion implantation may include oblique ion implantation. In some embodiments, the manufacturing method may include: before the ion implantation, forming side wall spacers on a plurality of side walls of the patterned layer. In some embodiments, the ion implantation is performed on the silicon carbide layer using the patterned layer and the side wall spacers as a mask.

BRIEF DESCRIPTION OF THE DRAWINGS

When the following detailed description is read with reference to the accompanying drawings, aspects of several embodiments of the present disclosure may be best understood. It should be noted that various structures may not be drawn to scale. Indeed, for clarity of discussion, the dimensions of the various structures can be arbitrarily enlarged or reduced.

Figure 1:
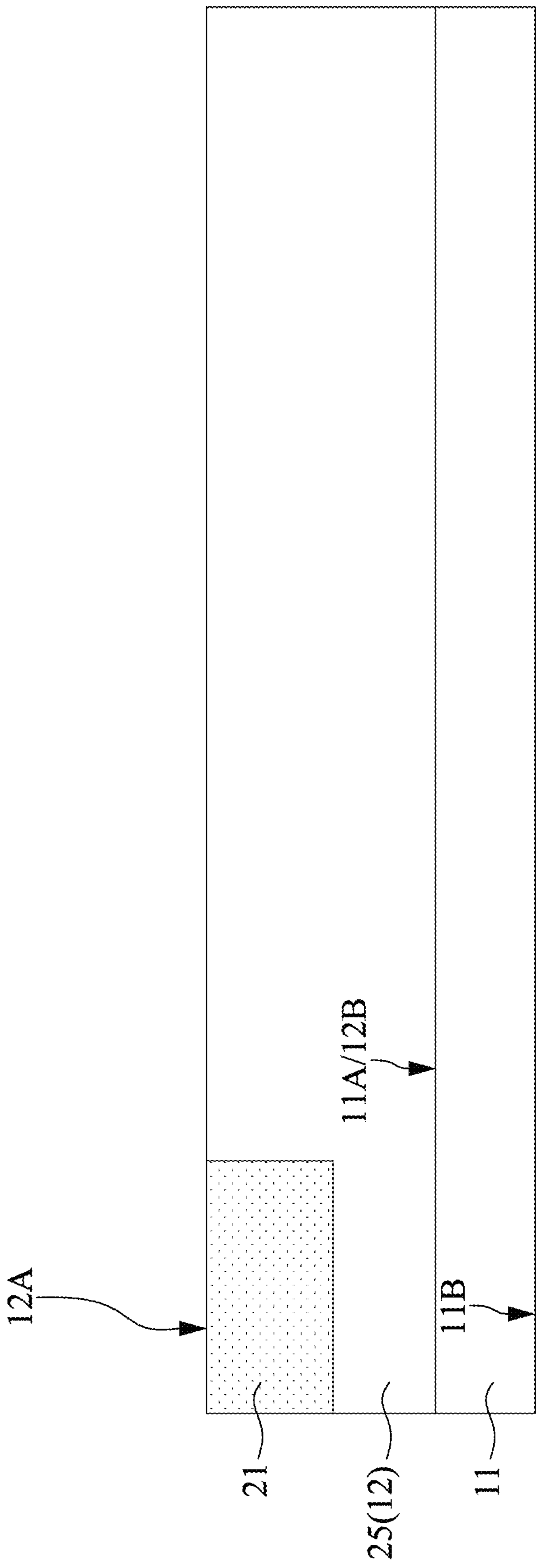
FIGS. 1, 2, 3, 4, 5, 6, 7, 8, 9, 10, 11, 12, 13, and 14 show one or more stages in a manufacturing method for a semiconductor rectifier device according to certain embodiments of the present case.

The same or similar components are denoted with the same reference signs in the drawings and detailed description. Several embodiments of the present disclosure will be immediately understood from the following detailed description with reference to the accompanying drawings.

DETAILED DESCRIPTION OF THE EMBODIMENTS

The following disclosure provides numerous different embodiments or examples for implementing different features of the presented subject matter. Specific examples of components and configurations will be described below. Of course, these are merely examples and are not intended to be limiting. In the present disclosure, the reference to forming a first feature above or on a second feature may include an embodiment in which the first feature and the second feature are formed in direct contact, and may further include an embodiment in which another feature may be formed between the first feature and the second feature such that the first feature and the second feature may not be in direct contact. Moreover, reference numerals and/or letters may be repeated in various examples of the present disclosure. This repetition is for simplicity and clarity, and does not per se indicate the relationship between the embodiments and/or configurations discussed.

The embodiments of the present disclosure will be discussed in detail below. However, it should be understood that the present disclosure provides a number of applicable concepts that can be embodied in a wide variety of particular environments. The specific embodiments discussed are merely illustrative and do not limit the scope of the present disclosure.

The present disclosure provides a semiconductor rectifier device and a manufacturing method therefor. Compared with a typical manufacturing method for semiconductor rectifier devices, the manufacturing method of the present disclosure includes performing an activation process before forming a polysilicon material or a dielectric material, thereby allowing for good integration of a rectifier device on silicon carbide. Furthermore, the manufacturing method of the present disclosure also includes a gate structure self-alignment step, which can reduce possible damage to base materials caused by a patterning process, while also reducing the use of a photomask to reduce overall process costs.

FIGS. 1 to 14 show one or more stages in a manufacturing method for a semiconductor rectifier device 1 according to certain embodiments of the present case. At least some of these figures have been simplified to facilitate a better understanding of aspects of the present disclosure.

Referring to FIG. 1, the manufacturing method for the semiconductor rectifier device 1 includes performing epitaxial growth on a surface 11A of a semiconductor material layer 12 to form a silicon carbide layer 12, and forming a doped region 21 in the silicon carbide layer 12. The semiconductor material layer 11 has opposing surfaces 11A and 11B. In some embodiments, the surface 11A and the surface 11B may be horizontal planes. For convenience of description, a direction orthogonal to the surface 11A and the surface 11B is defined as a vertical direction, and a direction orthogonal to the vertical direction is defined as a horizontal direction. In some embodiments, the surface 11A is a top surface of the semiconductor material layer 11 and the surface 11B is a bottom surface of the semiconductor material layer 11. In some embodiments, the surface 11A is a top surface of a silicon wafer. The material of the semiconductor material layer 11 may be polysilicon or monocrystalline silicon. The semiconductor material layer 11 may include a doped region. For example, the semiconductor material layer 11 includes a P-type doped region configurable as an N-type transistor, and an N-type doped region configurable as a p-type transistor. The N-type doped region is doped with an N-type dopant, such as phosphorous, arsenic, other N-type dopants, or a combination thereof. The P-type doped region is doped with a P-type dopant, such as boron, indium, other P-type dopants, or a combination thereof. The N-type or P-type doped region may be formed by performing an ion implantation process, a diffusion process and/or another suitable doping process. The semiconductor material layer 11 has a first type of doped region, extending from the surface 11A to the surface 11B, and covering the entire surface 11A. For convenience of description, the first type below is described by using the N-type as an example, but the present disclosure is not limited thereto. The N-type (first-type) or P-type (second-type) semiconductor material layer 11 may be adjusted according to the conductivity type of the semiconductor rectifier device 1.

The silicon carbide layer 12 has the same conductivity type as the semiconductor material layer 11, i.e., the first type of doping. In some embodiments, ions having N-type electrical properties are introduced into the epitaxial growth to form an N-type silicon carbide layer 12 without needing to perform additional ion implantation. Therefore, the ions having N-type electrical properties can be distributed throughout the silicon carbide layer 12 to form a doped region 25 located in the entire silicon carbide layer 12. The silicon carbide layer 12 may have a surface 12A, and a surface 12B opposite to the surface 12A. In some embodiments, the surface 12A and the surface 12B may be horizontal planes. In some embodiments, the surface 12A is a top surface of the silicon carbide layer 12 and the surface 12B is a bottom surface of the silicon carbide layer 12. In some embodiments, the surface 12B of the silicon carbide layer 12 makes surface contact with the surface 11A of the semiconductor material layer 11.

Next, ion implantation is performed on the surface 12A of the silicon carbide layer 12 to form a doped region 21 having the second type of doping. In some embodiments, the doped region 21 serves as a doped region for a circuit terminal, which is also referred to as a terminal doped region. In some embodiments, the doped region 21 functions as a guard ring. In some embodiments, the doped region 21 is of a ring shape (not drawn in the figures) when looked at from a top view. The doped region 21 may be formed by forming an oxide layer on the surface 12A of the silicon carbide layer 12, then forming a patterned photomask on the oxide layer. The oxide layer is patterned using the patterned photomask. After the photomask is removed, ion implantation is performed on the surface 12A of the silicon carbide layer 12 using the patterned oxide layer as a mask. The patterned oxide layer is removed after the ion implantation step. The method for forming the doped region 21 described above is an exemplary description provided according to some embodiments of the present disclosure, but the present disclosure is not limited thereto. In addition, since the doped region 21 offsets the conductivity of the doped region 25, electrically speaking, the coverage range of the doped region 25 is defined as a part of the silicon carbide layer 12 outside of the doped region 21.

Figure 2:
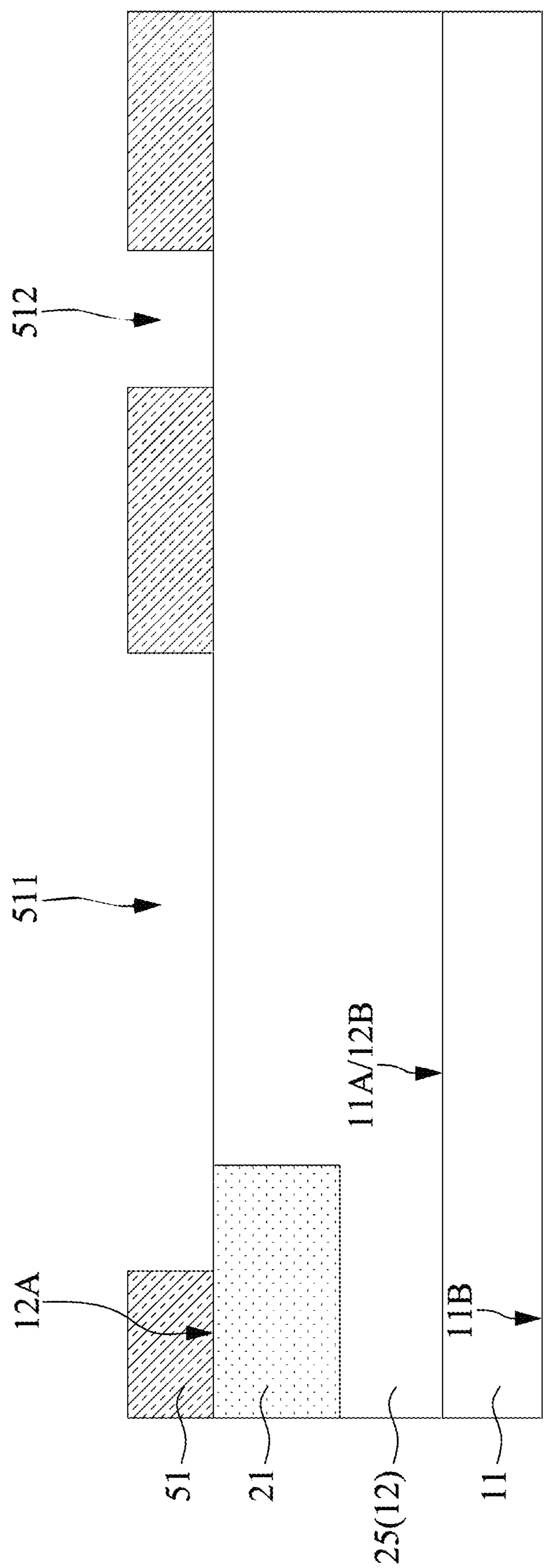

Referring to FIG. 2, the manufacturing method for the semiconductor rectifier device 1 includes forming a patterned layer 51 on the surface 12A of the semiconductor material silicon carbide layer 12, exposing a part of the silicon carbide layer 12 and covering a part of the doped region 21. In some embodiments, the patterned layer 51 exposes a part of the doped region 21 and a part of the silicon carbide layer 12 connected to the doped region 21. In some embodiments, the patterned layer 51 has an opening 511 and an opening 512 exposing a part of the silicon carbide layer 12. The patterned layer 51 may be a photomask, a hardened layer, a dielectric layer (e.g., an oxide layer or a nitride layer), or any other material layer suitable as a mask for a subsequent etching process. In some embodiments, the patterned layer 51 includes an oxide (e.g., silicon oxide). In some embodiments, an oxide layer is formed so that the entire layer completely covers the surface 12A of the silicon carbide 12, a patterned photomask is formed on the oxide layer, a part of the oxide layer is removed using the patterned photomask, and the photomask is then removed, so as to form the patterned layer 51 that exposes a part of the silicon carbide layer 12.

Figure 3:
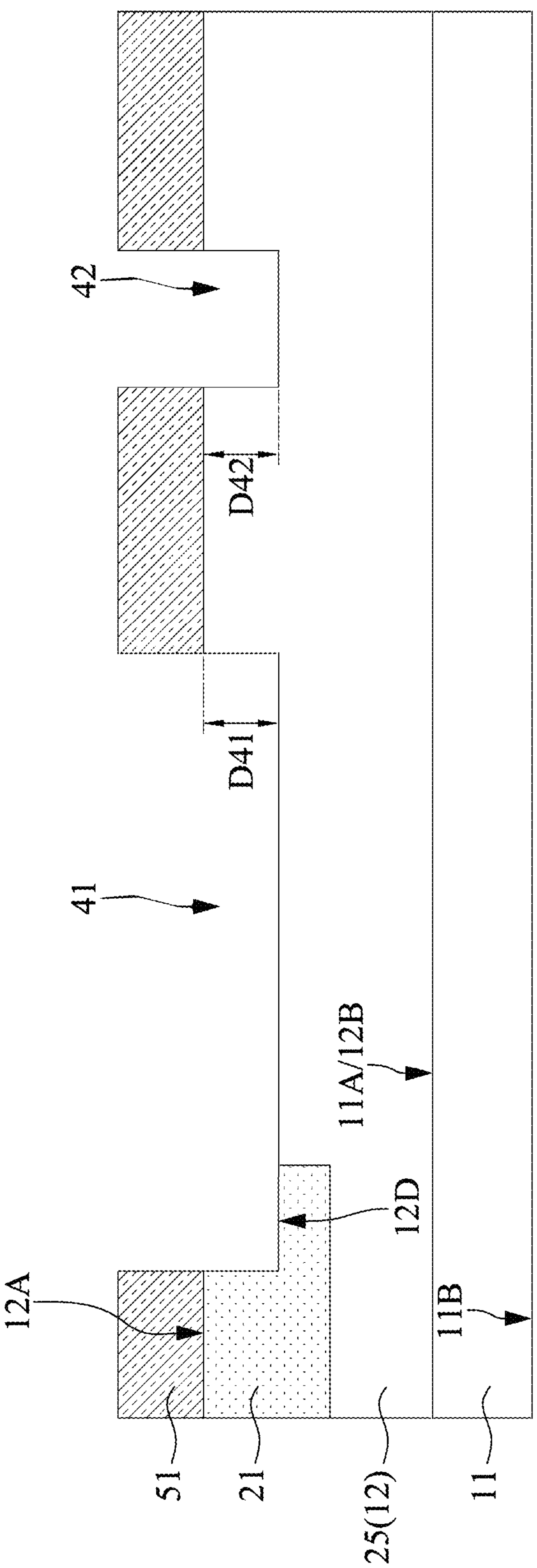

Referring to FIG. 3, the manufacturing method for the semiconductor rectifier device 1 includes performing an etching process on the silicon carbide layer 12 using the patterned layer 51 as a mask to form a plurality of trenches (trenches 41 and 42 shown in FIG. 3). The plurality of trenches are adjacent to each other and extend from the surface 12A of the silicon carbide layer 12 to the surface 12B. Being formed by the same etching step, the plurality of trenches have approximately the same depth. In some embodiments, the bottom surfaces of the plurality of trenches are generally located on the same horizontal plane 12D. In some embodiments, the depth D41 of the trench 41 is approximately the same as the depth D42 of the trench 42. In some embodiments, the depth D41 of the trench 41 or the depth D42 of the trench 42 is between 4000 and 5000 angstroms. In some embodiments, the bottom surface 41B of the trench 41 and the bottom surface 42D of the trench 41 have an approximately the same horizontal height on the horizontal plane 12. In some embodiments, the bottom surface 41B of the trench 41 and the bottom surface 42D of the trench 41 are located on the same horizontal plane 12. In some embodiments, the depth of the plurality of trenches 41 and 42 is less than the depth of the doped region 21. Since the patterned layer 51 exposes a part of the doped region 21, and the depth of the trench 41 is less than the depth of the doped region 21, the doped region 21 may thus abut against the side wall 41D and a part of the bottom surface 41B of the trench 41. In addition, since the plurality of trenches (including the trenches 41 and 42) are formed using the patterned layer 51 as a mask, the patterned layer 51 thus corresponds to a plurality of openings of the plurality of trenches. Side walls 41C and 41D of the trench 41 are aligned with side walls of the corresponding first opening 511 of the patterned layer 51, and side walls 42C and 42D of the trench 42 are aligned with side walls of the corresponding second opening 512 of the patterned layer 51, wherein the side walls 41C and 41D are separately connected to the bottom surface 41B and opposite to each other, and the side walls 42C and 42D are separately connected to the bottom surface 42B and opposite to each other. In some embodiments, the first opening 511 of the patterned layer 51 overlaps with a part of the doped region 21 in the vertical direction, as shown in FIG. 3.

Figure 4:
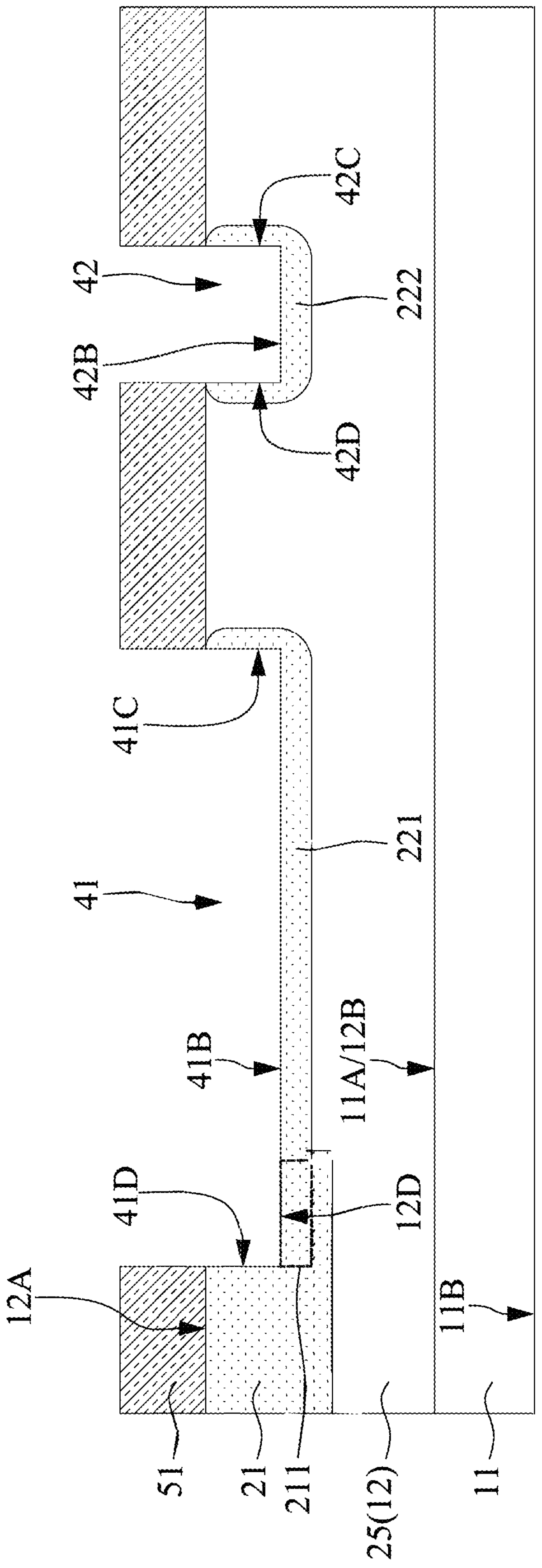

Referring to FIG. 4, the manufacturing method for the semiconductor rectifier device 1 includes performing ion implantation on the silicon carbide layer 12 using the patterned layer 51 as a mask to form a plurality of doped regions 22, wherein the plurality of doped regions 22 have the same conductivity type as the doped region 21. Similar to the above description, since the doped region 22 offsets the conductivity of the doped region 25, electrically speaking, the coverage range of the doped region 25 is defined as a part of the silicon carbide layer 12 outside of the doped regions 21 and 22.

The plurality of doped regions 22 include a doped region 221 and a doped region 222. In some embodiments, the doped region 221 extends from the surface 12A to the surface 12B, and abuts against the side wall 41C and a part of the bottom surface 41B of the trench 41. In some embodiments, the doped region 221 extends toward the interior of the silicon carbide layer 12 along the side walls 41C and a part of the bottom surface 41B of the trench 41. In order to enable the plurality of doped regions 22 to separately diffuse laterally along corresponding trench side walls thereof, the steps shown in FIG. 4 include at least one instance of angle ion implantation. In some embodiments, the steps shown in FIG. 4 include multiple ion implantations, at least one of which is an oblique ion implantation. In some embodiments, the steps shown in FIG. 4 include multiple oblique ion implantations, and different tilt angles may be set for different instances of oblique ion implantations, so as to achieve a desired lateral diffusion range. In some embodiments, the depth of the doped region 21 from the surface 12A to the surface 12B is greater than or equal to the depth of the doped region 22 from the surface 12A to the surface 12B.

Since the patterned layer 51 exposes a part of the doped region 21, the doped region 221 is in contact with the doped region 21. In some embodiments, the ion implantation step of FIG. 4 will implant ions into the exposed doped region 21, such as a region 211 marked with a dotted box in FIG. 4, which represents a region subjected to a second ion implantation in the doped region 21. Therefore, the region 211 will have a higher doping concentration. The plurality of doped regions 22 serve as body doped regions of the semiconductor rectifier device 1, and the doped region 21 serves as a terminal doped region. The region 211 is covered by a dielectric material in a subsequent step, and does not function as a body doped region but as a terminal doped region. Therefore, for convenience of description, the region 211 is defined as a part of the doped region 21, and the boundary between the region 211 and the doped region 221 is equivalent to the boundary between the doped region 21 and the doped region 221. In some embodiments, the region 211 has a higher doping concentration than that of the doped region 221. In some embodiments, the region 211 has a higher doping concentration than that of other parts of the doped region 21. In some embodiments, the doped region 22 has a different doping concentration from that of the doped region 21. In some embodiments, the doping concentration of the doped region 21 is between $1*10^{17}$ and $1*10^{18}$ per cubic centimeter ($cm^{-3}$). In some embodiments, the doping concentration of the doped region 22 is between $1*10^{16}$ and $1*10^{17}$ $cm^{-3}$.

The doped region 222 is adjacent to and separated from the doped region 221. In some embodiments, the doped region 222 extends from the surface 12A to the surface 12B, and abuts against the opposite side walls 42C, 42D and the bottom surface 42B of the trench 42. In some embodiments, the doped region 222 extends toward the interior of the silicon carbide layer 12 along the side walls 42C and 42D and the bottom surface 42B of the trench 41. The doped region 222 and the doped region 221 are formed by the same ion implantation step, and therefore the doped region 222 has approximately the same depth and doping concentration as that of the doped region 221.

Figure 5:
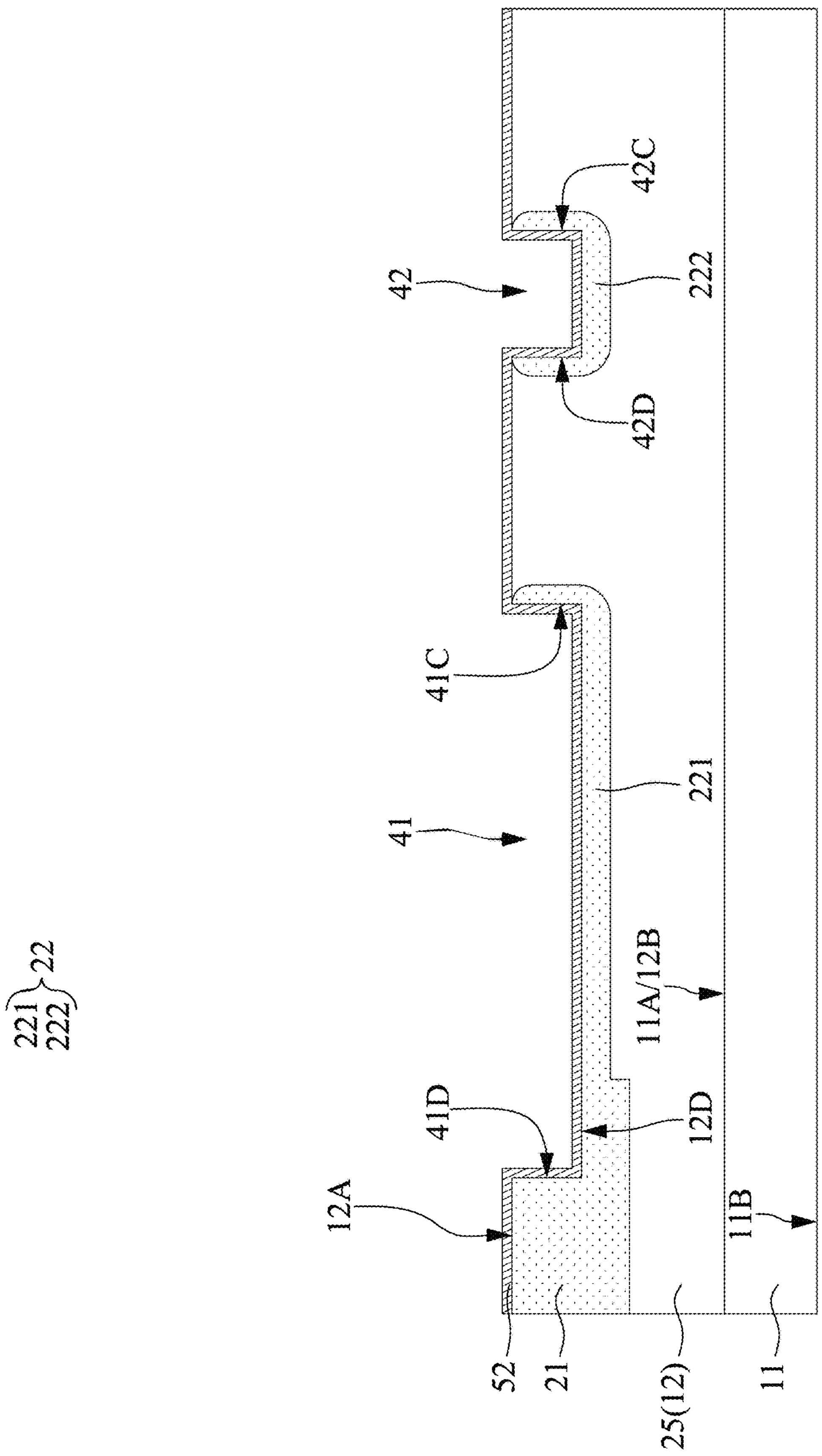

Referring to FIG. 5, the manufacturing method for the semiconductor rectifier device 1 includes forming a carbon-containing layer 52 to cover the silicon carbide layer 12, and then performing high-temperature annealing on the silicon carbide layer 12. In some embodiments, the carbon-containing layer 52 covers the entire silicon carbide layer 12. In some embodiments, the carbon-containing layer 52 conformally covers the silicon carbide layer 12. Since high-temperature annealing will subsequently be performed on the silicon carbide layer 12 to activate the ions in the doped regions 21 and 22, the carbon-containing layer 52 can prevent silicon from precipitating out at high temperatures. After the carbon-containing layer 52 is formed, high-temperature annealing is performed on the silicon carbide layer 12. In some embodiments, the temperature of the high-temperature annealing step is between 1,400 and 2,500 degrees Celsius (C). In some embodiments, the time for which the high-temperature annealing step is performed is between 20 and 40 minutes. The carbon-containing layer 52 is removed after the high-temperature annealing step.

Figure 6:
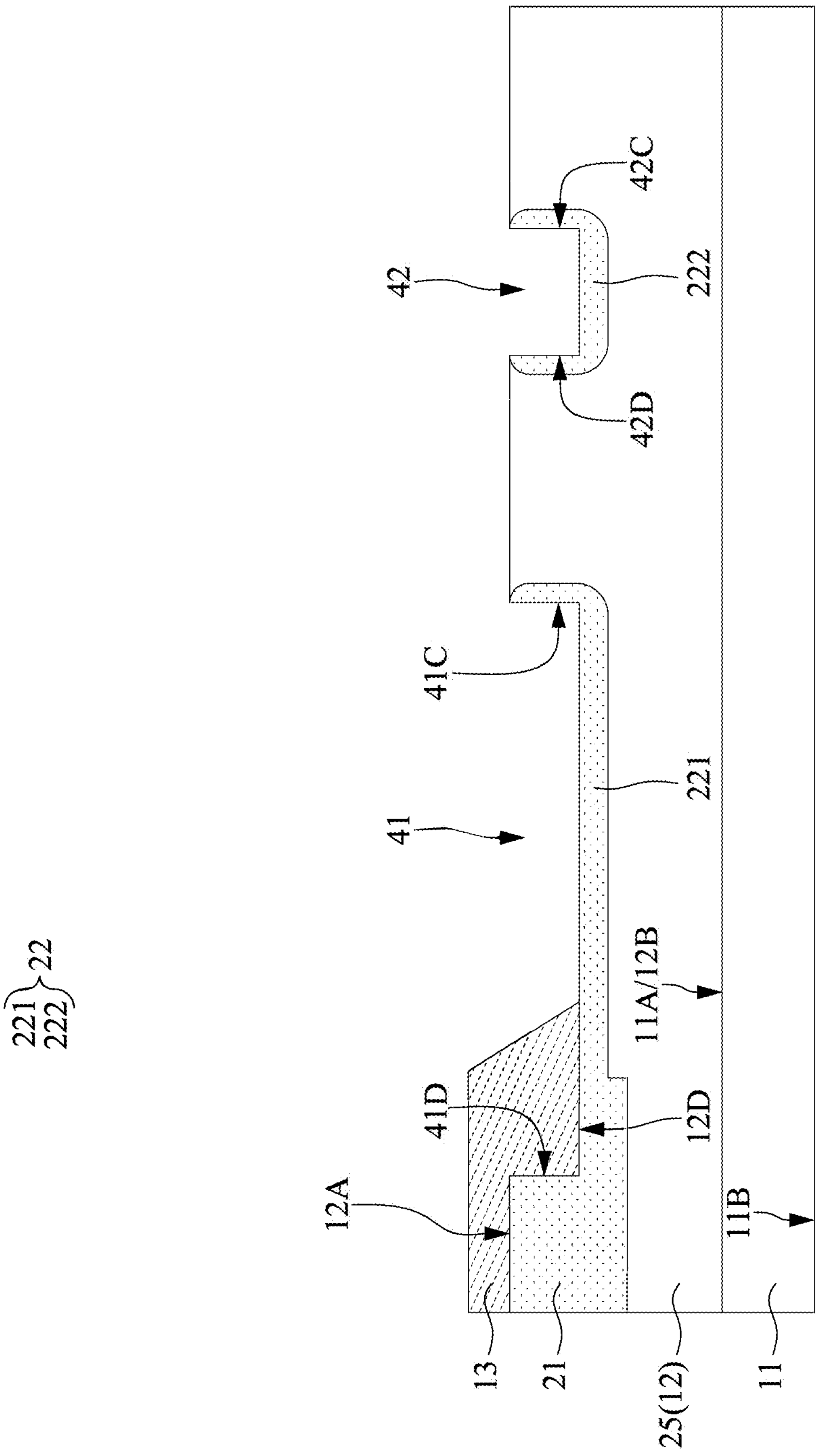

Referring to FIG. 6, the manufacturing method for the semiconductor rectifier device 1 includes forming a dielectric layer 13 to cover the doped region 21 after the high-temperature annealing step. In order to ensure that the dielectric layer 13 covers the entire doped region 21, the dielectric layer 13 may further cover a part of the doped region 221 abutting against the doped region 21. For a method for forming the dielectric layer 13, reference may be made to the aforementioned method for forming the patterned layer 51, and a description thereof will not be repeated here. In some embodiments, the dielectric layer 13 covers the side wall 41D and a part of the bottom surface 41B of the trench 41. In some embodiments, the dielectric layer 13 includes an oxide (e.g., silicon oxide).

Figure 7:
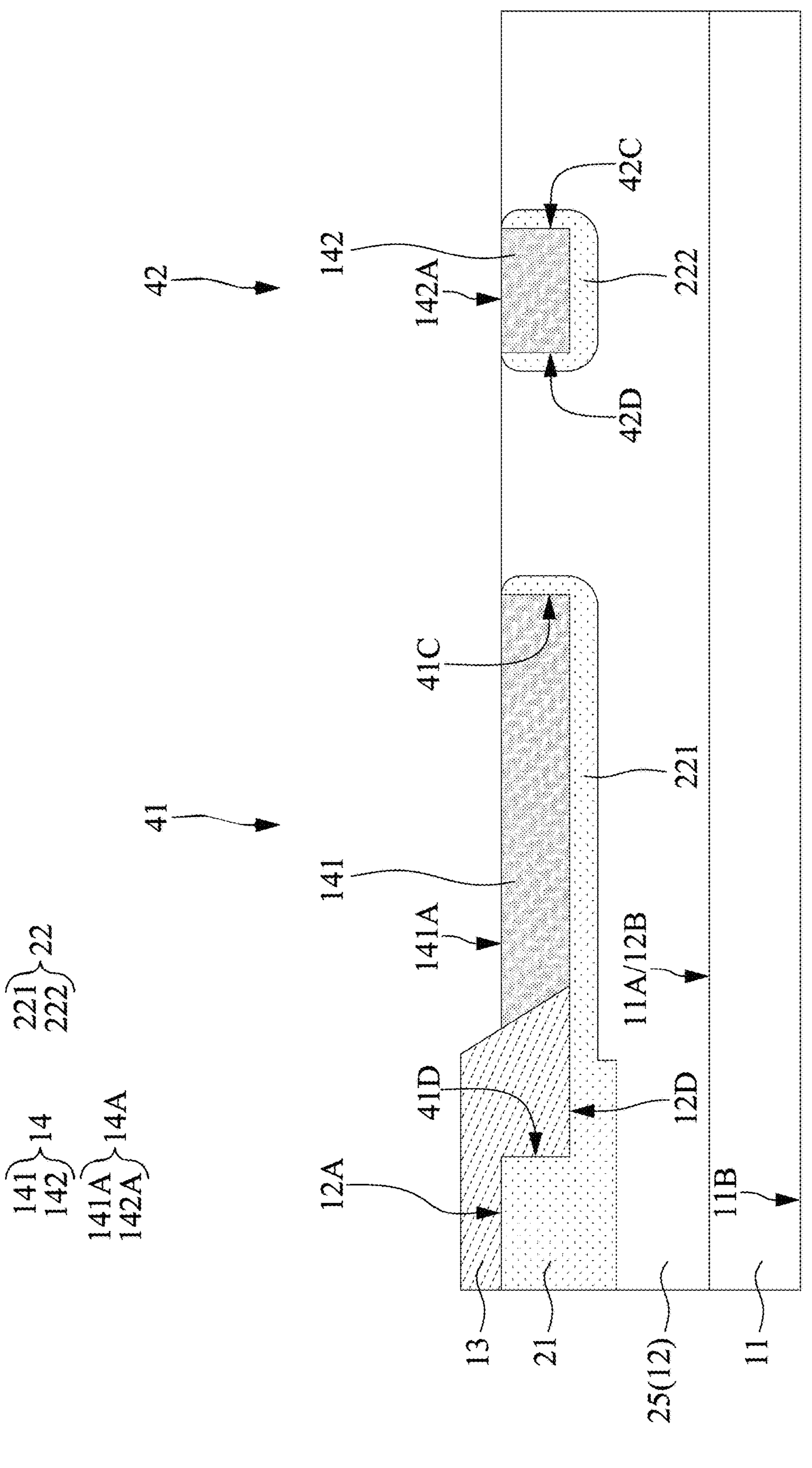

Referring to FIG. 7, the manufacturing method for the semiconductor rectifier device 1 includes forming a dielectric layer 14 to fill the remaining trenches 41 and 42 after the dielectric layer 13 is formed. In some embodiments, a deposition process is performed to form a dielectric material to cover the entire silicon carbide layer 12, and then the dielectric material is dry etched to remove a part of the dielectric material that is above the surface 12A, so as to form the dielectric layer 14. In some embodiments, the dielectric material has an etch selectivity ratio with the silicon carbide layer 12, so the dry etching step is stopped at the surface 12A of the silicon carbide layer 12.

The top surface 14A of the dielectric layer 14 is horizontally aligned or coplanar with the surface 12A of the silicon carbide layer 12. The dielectric layer 14 may include a plurality of parts filling a plurality of trenches. In some embodiments, the dielectric layer 14 includes a part of the dielectric layer 141 located in the trench 41 and a part of the dielectric layer 142 located in the trench 42. In some embodiments, the top surface 141A of the part of the dielectric layer 141 is horizontally aligned or coplanar with the surface 12A of the silicon carbide layer 12. In some embodiments, the top surface 142A of the part of the dielectric layer 142 is horizontally aligned or coplanar with the surface 12A of the silicon carbide layer 12. In some embodiments, the top surface 142A of the part of the dielectric layer 142 is located at an approximately the same horizontal height as the top surface 142A of the part of the dielectric layer 142. Furthermore, to have an etching selectivity ratio between the dielectric layer 13 and the dielectric layer 14 in the subsequent etching process, the dielectric layer 14 has a different dielectric material from the dielectric layer 13. In some embodiments, the dielectric layer 14 includes nitride (e.g., silicon nitride).

Figure 8:
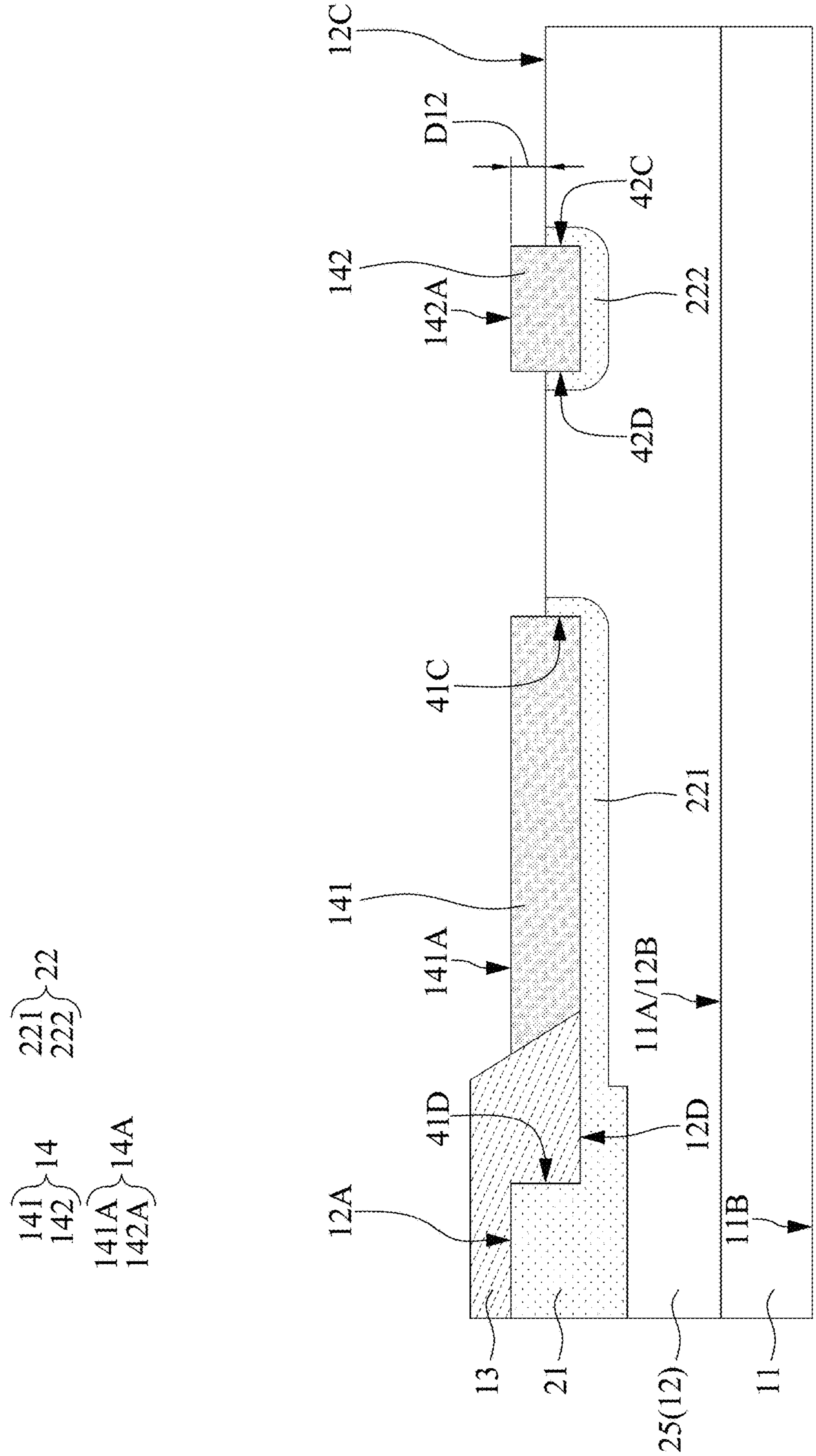

Referring to FIG. 8, the manufacturing method for the semiconductor rectifier device 1 includes removing a part of the silicon carbide layer 12 so that the top surface of the exposed part of the silicon carbide layer 12 is lower than the top surface 14A of the dielectric layer 14. In some embodiments, the silicon carbide layer 12 is dry etched to remove a part of the silicon carbide layer 12 that is not covered by the dielectric layers 13 and 14. The silicon carbide layer 12 after the dry etching step has an exposed surface 12C, and the surface 12C has a horizontal height lower than the horizontal height of the surface 12A and higher than the horizontal height of the bottom surfaces of the plurality of trenches (including 41 and 42). In some embodiments, the surface 12C may be a horizontal plane. In some embodiments, the top surface of the silicon carbide layer 12 after the dry etching step includes horizontal planes having different horizontal heights. In some embodiments, the top surface of the silicon carbide layer 12 after the dry etching step includes a surface 12A and a surface 12C, and the horizontal height of the surface 12A is higher than the horizontal height of the surface 12C. The dry etching step removes the silicon carbide layer 12 of a preset thickness, and the preset thickness is smaller than the depth of the trench 41. Since a gate electrode structure will be formed on the surface 12C in a subsequent step, and the thickness of the removed silicon carbide layer 12 will determine the thickness of the gate electrode structure, the preset thickness can thus be adjusted according to the required thickness of the gate electrode structure. In some embodiments, the dry etching step may be in a time-mode, and the dry etching step is performed at a preset time to control the thickness of the removed silicon carbide layer 12 to reach the preset thickness. In some embodiments, the preset thickness is between 1000 angstroms and 3000 angstroms. In other words, the vertical distance D12 between the surface 12C of the silicon carbide layer 12 and the top surface 14A (including the top surfaces 141A and 142A) of the dielectric layer 14 is between 1000 angstroms and 3000 angstroms. In some embodiments, the part of the silicon carbide layer 12 covered by the dielectric layer 13 retains a part of the surface 12A, and the vertical distance (equivalent to D12) between the surface 12C and the surface 12A is between 1000 angstroms and 3000 angstroms. In some embodiments, the side walls 41C, 42C and 42D have approximately the same height. In some embodiments, the height of the side wall 41D is greater than the height of the side wall 41C, 42C or 42D.

It is worth noting that since the gate structure will be formed on the surface 12C of the silicon carbide layer 12 in a subsequent step, the silicon carbide layer 12 adjacent to the surface 12C between the trenches 41 and 42 will form a channel when the semiconductor rectifier device 1 operates, and the doped regions 221 and 222 extend laterally to the silicon carbide layer 12 below the gate structure, which will facilitate current flow. As shown in FIG. 4 above, due to the coverage of the patterned layer 51, even if oblique ion implantation is performed, the range of the doped regions 221 and 222 making contact with the surface 12A is very limited. However, after the dry etching process of FIG. 8, the range of the doped regions 221 and 222 making contact with the surface 12C increases, which facilitates current flow and improves the efficiency of the semiconductor rectifier device 1. In some embodiments, the height of the side wall 41C is less than the height of the side wall 41D after the dry etching step. In some embodiments, after the dry etching step, the doped region 221 abuts against the corner of the side wall 41C and the surface 12C. In some embodiments, the doped region 221 abuts against the side wall 41C and a part of the surface 12C after the dry etching step. Similarly, the height of the side walls 42C and 42D of the trench 42 is approximately the same as the height of the side wall 41C. In addition, the positional relationship between the doped region 222 and the surface 12C is similar to the positional relationship between the doped region 221 and the side wall 41C, and will not be repeated here.

Figure 9:
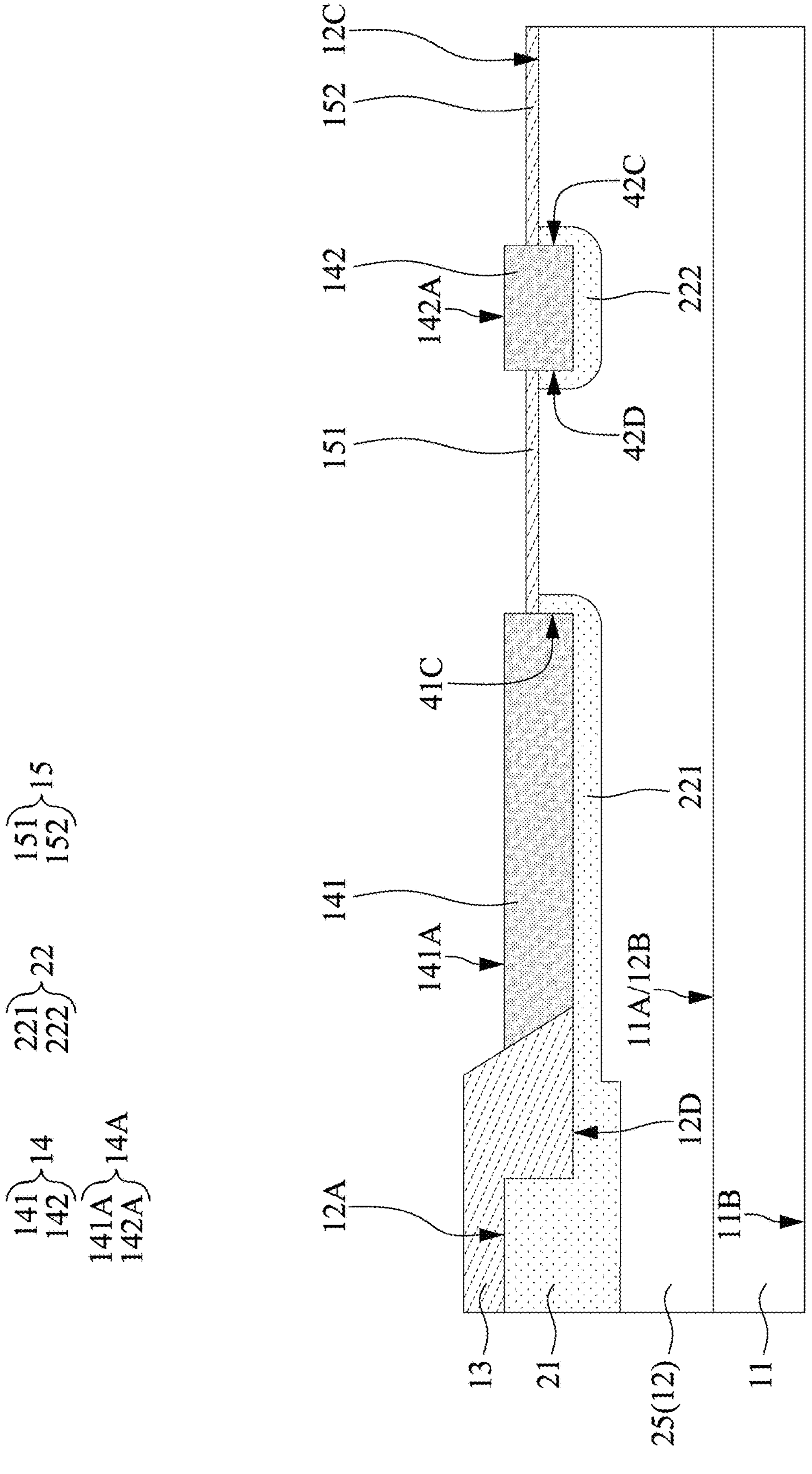

Referring to FIG. 9, the manufacturing method for the semiconductor rectifier device 1 includes forming a dielectric layer 15 on the exposed surface 12C of the silicon carbide layer 12. In some embodiments, the dielectric layer 15 includes an oxide (e.g., silicon oxide). In some embodiments, the silicon carbide layer 12 undergoes a thermal oxidation step to form the dielectric layer 15. In some embodiments, the dielectric layer 15 has a thickness of between 50 angstroms and 200 angstroms. In some embodiments, the dielectric layer 15 serves as a gate dielectric layer for the gate structure that will be formed later. In some embodiments, the dielectric layer 15 covers the entire exposed surface 12C of the silicon carbide layer 12. The dielectric layer 15 includes a plurality of parts, each extending between adjacent parts of the dielectric layer 14. For example, the dielectric layer 15 includes a part of the dielectric layer 151 and a part of the dielectric layer 152. In some embodiments, the parts of the dielectric layers 151 and 152 are separated from each other. In some embodiments, the part of the dielectric layer 151 extends between the trenches 41 and 42 on the surface 12C. In some embodiments, the part of the dielectric layer 151 is located between the parts of the dielectric layers 141 and 142, and is in contact with the parts of the dielectric layers 141 and 142. In some embodiments, the part of the dielectric layer 152 extends between the part of the dielectric layer 142 and another adjacent part (not shown) of the dielectric layer 14 on the surface 12C.

Figure 10:
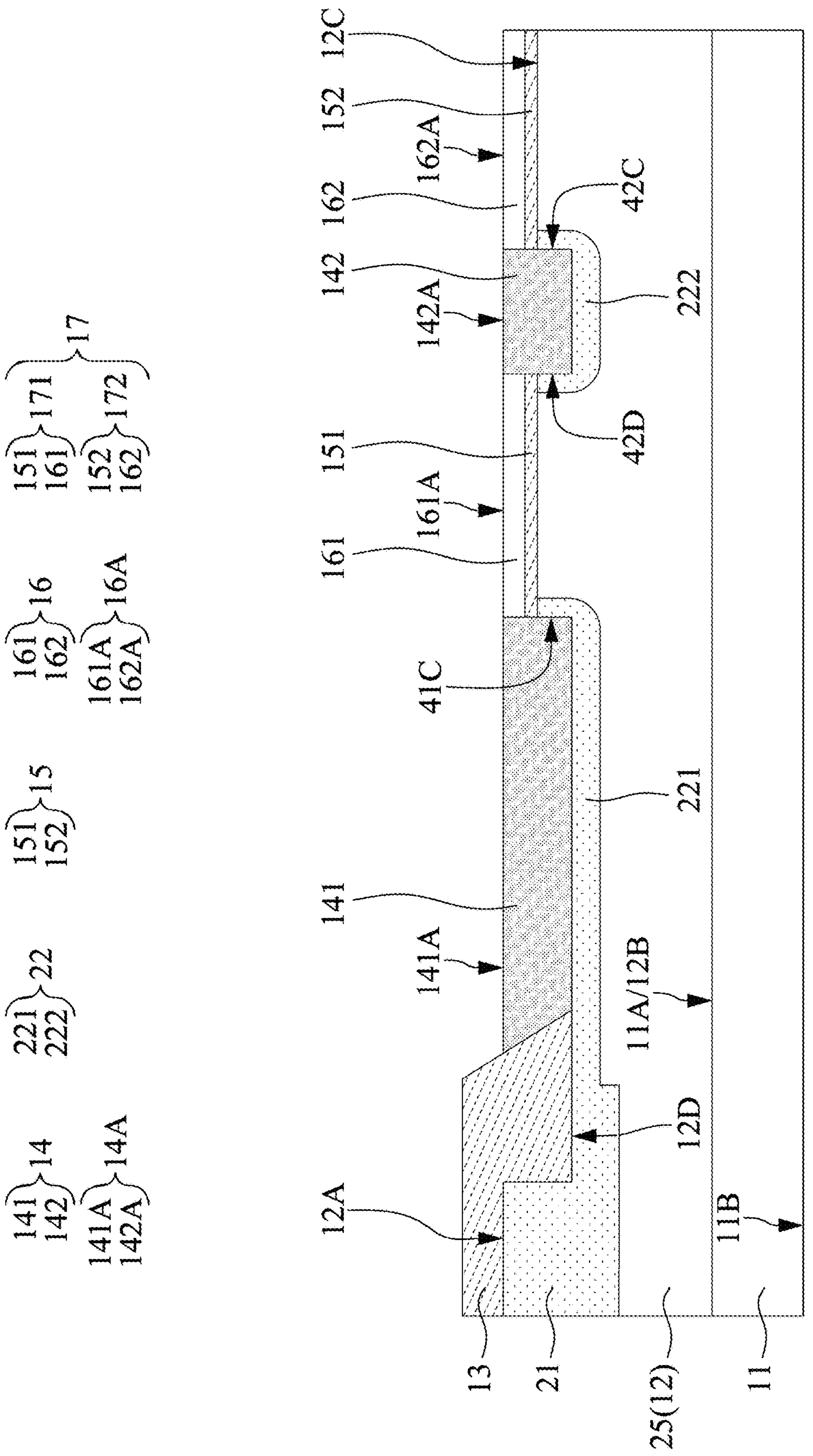

Referring to FIG. 10, the manufacturing method for the semiconductor rectifier device 1 includes forming a gate electrode layer 16 on the dielectric layer 15. In some embodiments, the gate electrode layer 16 includes polysilicon. In some embodiments, a deposition step is performed to form a gate electrode material to cover the entire silicon carbide layer 12, and then an etching step is performed to remove the gate electrode material that is above the top surface 14A of the dielectric layer 14, so as to form the gate electrode layer 16. Similar to the dielectric layer 15, the gate electrode layer 16 also includes a plurality of parts, which are each formed on different parts of the dielectric layer 15. For example, the gate electrode layer 16 includes a gate electrode 161 on the part of the dielectric layer 151, and a gate electrode 162 adjacent to the gate electrode 161 on the part of the dielectric layer 152, and the gate electrodes 161 and 162 are separated from each other. Since the gate electrode layer 16 and the dielectric layer 14 have an etch selectivity ratio, the etching step of the gate electrode material is stopped at the top surface 14A of the dielectric layer 14. Therefore, the top surface 16A of the gate electrode layer 16 and the top surface 14A of the dielectric layer 14 are located at an approximately the same horizontal height. In some embodiments, the top surface 16A of the gate electrode layer 16 is horizontally aligned or coplanar with the top surface 14A of the dielectric layer 14. In other words, the top surface 161A of the gate electrode 161 is at the same horizontal height as, or coplanar with, any one or more of the top surface 141A of the part of the dielectric layer 141, the top surface 142A of the part of the dielectric layer 142, and the top surface 162A of the gate electrode 162. Furthermore, since the surface 14A of the dielectric layer 14 is horizontally aligned or coplanar with the surface 12A of the silicon carbide layer 12, the top surface 16A of the gate electrode layer 16 is horizontally aligned or coplanar with the surface 12A of the silicon carbide layer 12. In other words, any one or more of the top surface 161A of the gate electrode 161 and the top surface 162A of the gate electrode 162 are located at the same horizontal height as the surface 12A of the silicon carbide layer 12.

Figure 11:
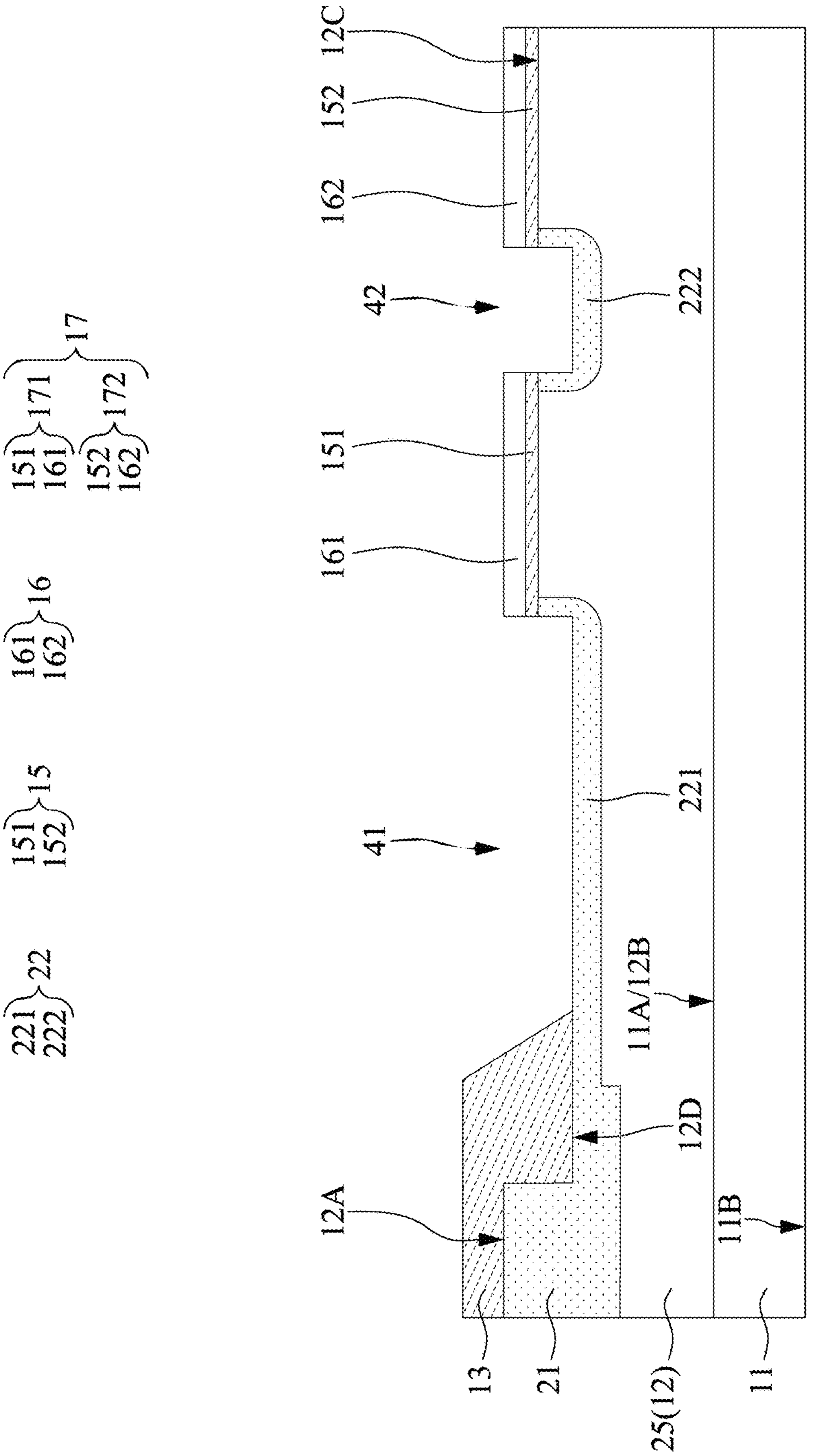

Referring to FIG. 11, the manufacturing method for the semiconductor rectifier device 1 includes removing the dielectric layer 14. In some embodiments, wet etching is performed to remove the dielectric layer 14 in the trenches 41 and 42. The gate electrode 161 and the part of the dielectric layer 151 together form a gate structure 171, and the gate electrode 162 and the part of the dielectric layer 152 together form a gate structure 172. In some embodiments, a side wall of the gate structure 171 adjacent to the side wall 41C is aligned with the side wall 41C when viewed from a cross-sectional view, and a side wall of the gate structure 171 adjacent to the side wall 42D is aligned with the side wall 42D when viewed from a cross-sectional view. The gate structure 172 has a similar configuration to that of the gate structure 171 and will not be described again here.

Figure 12:
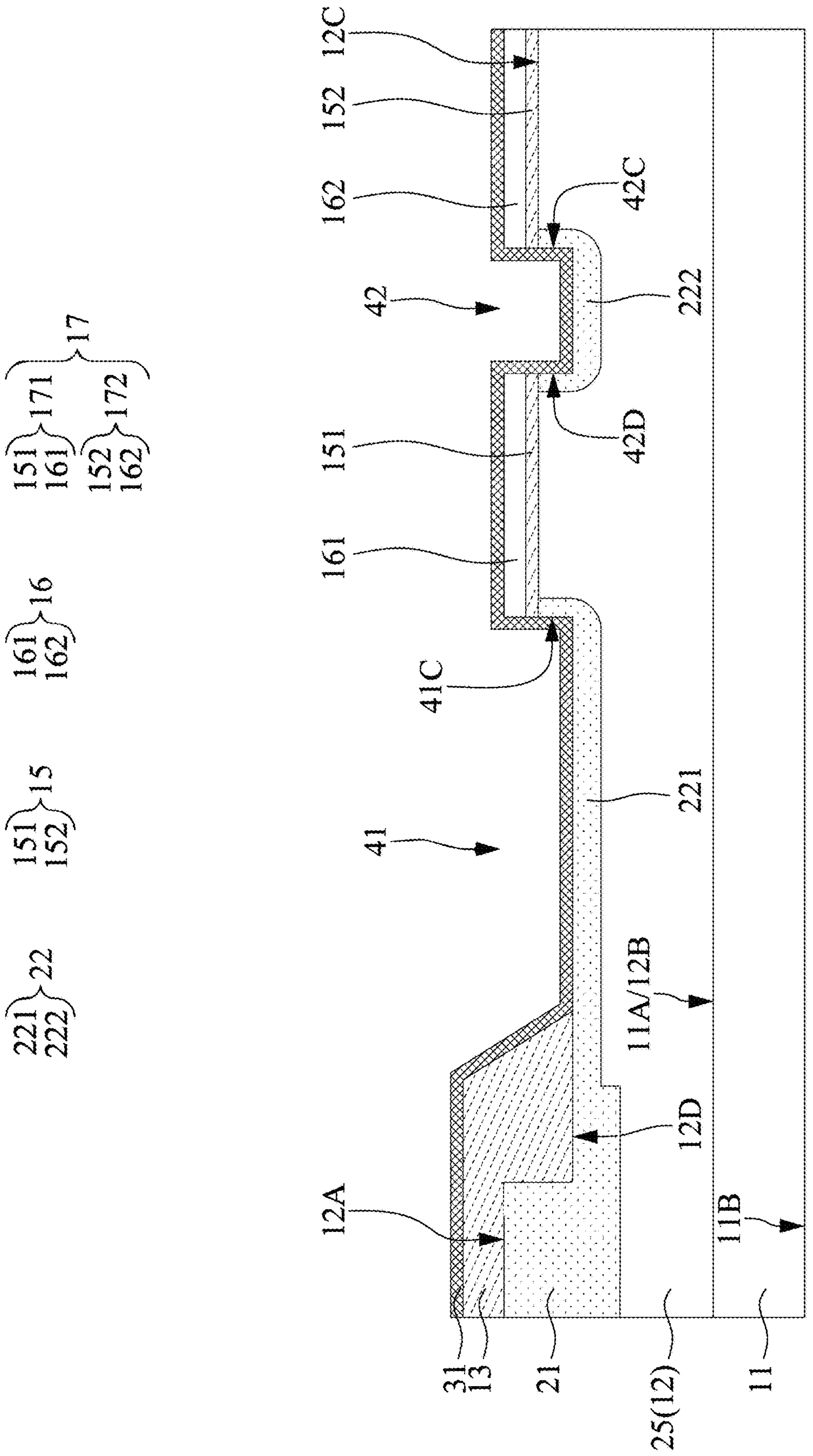

Referring to FIG. 12, the manufacturing method for the semiconductor rectifier device 1 includes conformally forming a contact metal layer 31 on the silicon carbide layer 12 and the gate structure 17. The contact metal layer 31 may include a suitable metal material, such as titanium (Ti), nickel (Ni), molybdenum (Mo), titanium nitride (TiN), molybdenum nitride (MoN), or a combination thereof. In some embodiments, the contact metal layer 31 is in contact with the side wall 41C and a part of the bottom surface 41B of the trench 41, and is in contact with the side walls 42C and 42D and the bottom surface 42B of the trench 42. In addition, since the process of forming the contact metal layer 31 or a subsequent process may pass through a step in which the temperature is between 400° C. and 600° C., metal silicide is thus formed between the contact metal layer 31 and the silicon carbide layer 12, and between the contact metal layer 31 and the gate electrode layer 16. The formation of metal silicide can reduce resistance between the contact metal layer 31 and the silicon carbide layer 12, or between the contact metal layer 31 and the gate electrode layer 16, which helps to improve the performance of the semiconductor rectifier device 1.

Figure 13:
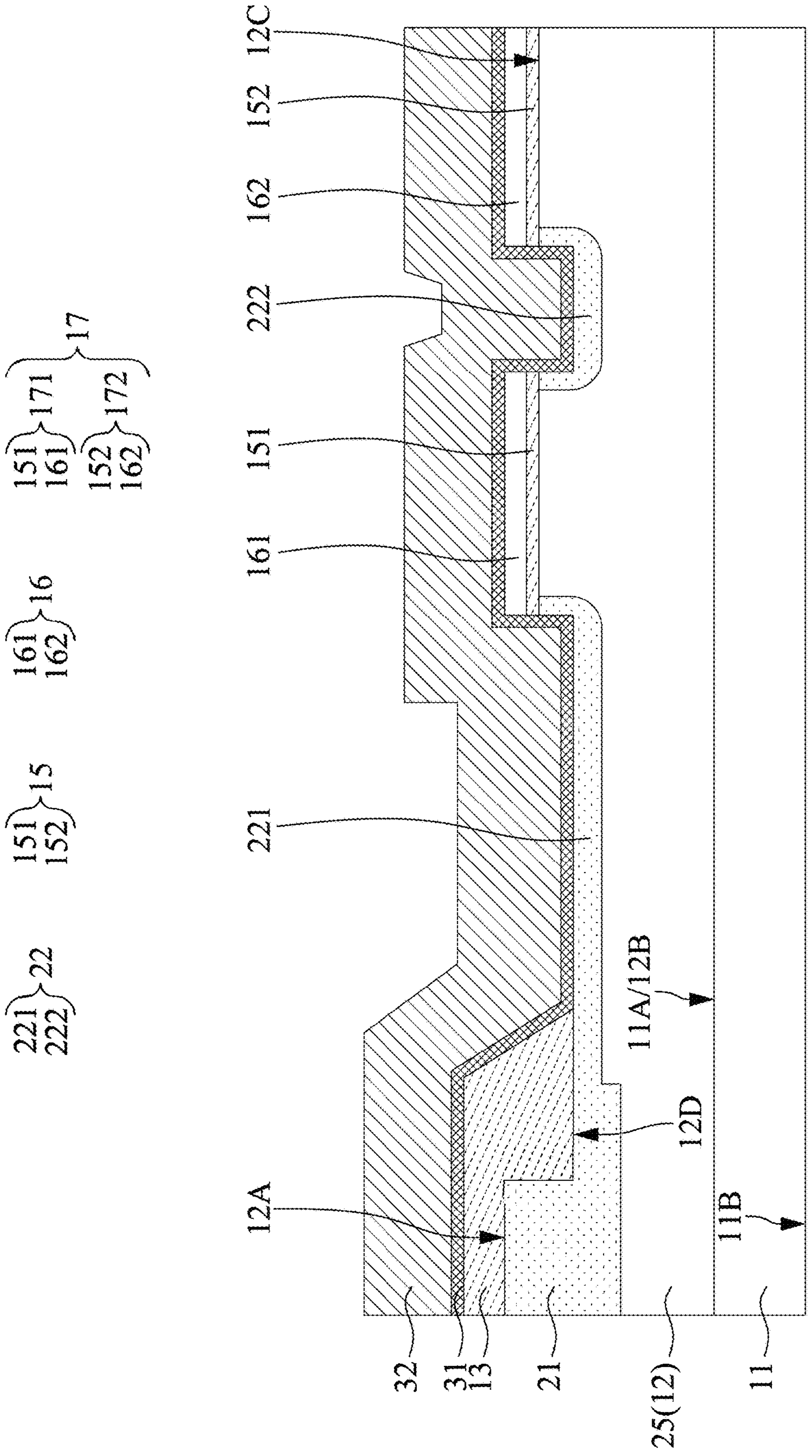

Referring to FIG. 13, the manufacturing method for the semiconductor rectifier device 1 includes forming a first electrode layer 32 on the contact metal 31. The first electrode layer 32 may include a suitable metal material or alloy, such as titanium tungsten (TiW), aluminum silicon copper alloy (AlSiCu) or a combination thereof, which is not limited here. After the first electrode layer 32 is formed, the first electrode layer 32 and the contact metal 31 may be etched so that a part of the gate structure 17 is electrically connected and a part of the gate structure 17 is electrically isolated. Since the etching step is performed according to a required circuit design, the etching step is not shown in the figure. A person skilled in the art could adjust the etching step according to the above content of the present disclosure to form a desired pattern of the first electrode layer 32 and a desired pattern of the contact metal 31.

Figure 14:
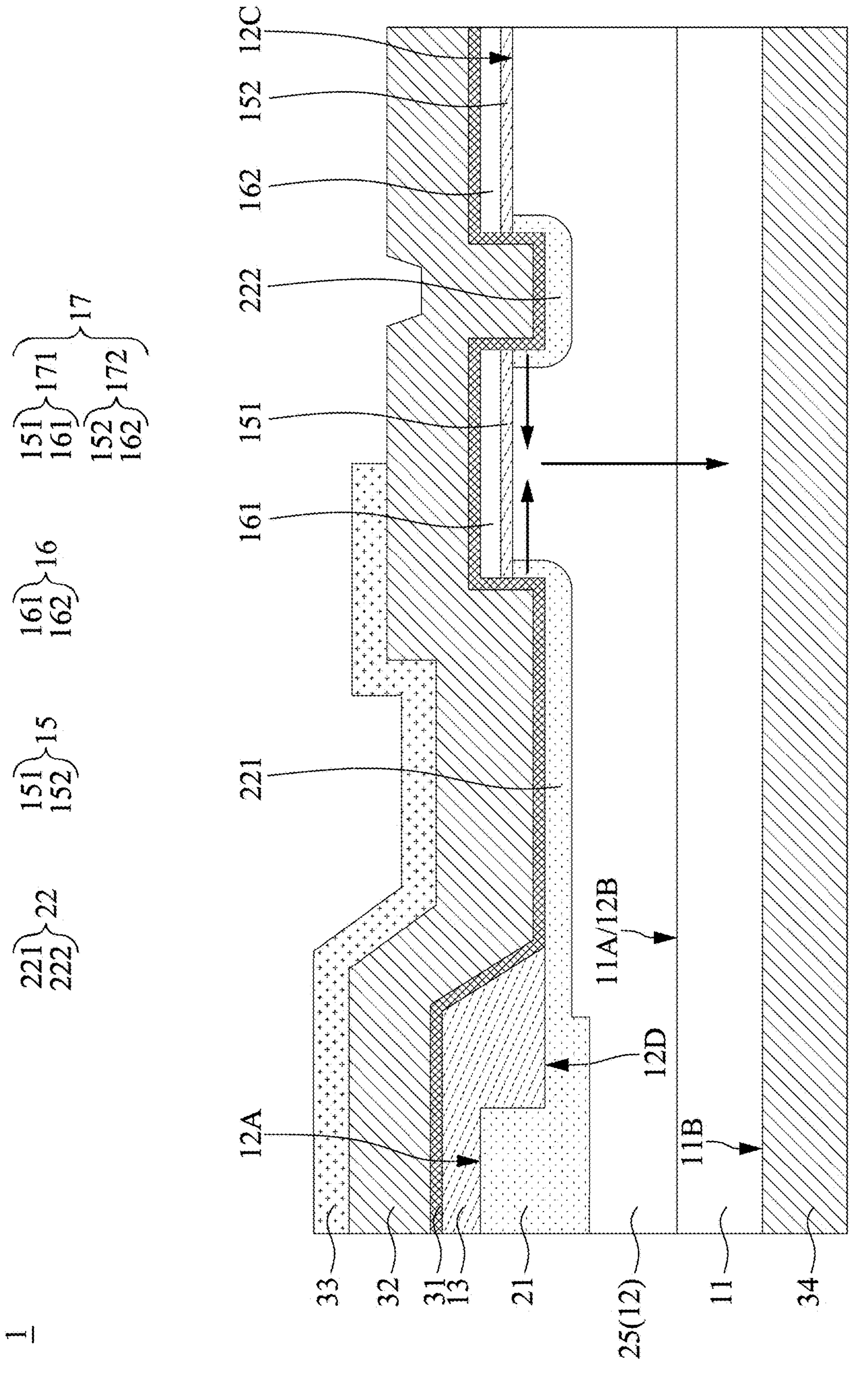

Referring to FIG. 14, the manufacturing method for the semiconductor rectifier device 1 includes forming a passivation layer 33 on the first electrode layer 32, and forming a second electrode layer 34 below the silicon carbide layer 12. In some embodiments, the passivation layer 33 may be formed by means of a deposition step and a patterning step. The passivation layer 33 exposes a part of the first electrode layer 32, which is used to electrically connect with a conductive plug in a subsequent process of forming the conductive plug (not shown in the figure). In some embodiments, the second electrode layer 34 has the same conductive material as that of the first electrode layer 32. The second electrode layer 34 and the first electrode layer 32 are located on two opposite sides of the silicon carbide layer 12. In some embodiments, the second electrode layer 34 is formed on the surface 11B of the semiconductor material layer 11.

In some embodiments, the second electrode layer 34 is in contact with the semiconductor material layer 11. In some embodiments, before forming the second electrode layer 34, the semiconductor material layer 11 is ground or etched to reduce the thickness of the semiconductor material layer 11.

Arrows in FIG. 14 are used to show the direction of current when the semiconductor rectifier device 1 is operating. It can be understood that the larger range of the doped region 221 laterally making contact with the surface 12C is helpful for the flow of the current. As described above, the aforementioned oblique angle ion implantation in FIG. 4 helps the doped region 22 to extend horizontally along the trench side walls (for example, 41C, 42C and 42D). However, since the patterned layer 51 will limit the horizontal extension range of the doped region 22 adjacent to the surface 12A, this problem can be solved by the aforementioned steps of FIG. 8. The part of the doped region 221 on the bottom surface of the gate structure 171 may provide an extended doped region (similar to a lightly doped drain (LDD) extension in a transistor), which can increase the operating speed of the semiconductor rectifier device 1.

The gate self-alignment process helps to reduce the use of a photomask, and in addition to avoiding alignment issues, may also reduce overall process costs. However, existing gate structure self-alignment processes use the gate structure as a mask to implant ions into a substrate. Therefore, the annealing step for activating ions needs to be performed after the gate structure is formed, causing a self-aligned gate to not be suitable for use with silicon carbide materials. According to the aforementioned steps of FIGS. 1 to 14, the high-temperature annealing step of the present disclosure is performed before the forming step of the gate structure 17. Therefore, the problem in the prior art that gate structures are damaged due to excessive annealing temperatures can be solved, and can be further applied to silicon carbide materials. Both the doped region 22 and the gate structure 17 can be defined by means of the patterned layer 51 without the need for additional photomasks, achieving the effect of the self-aligned gate processes in the prior art. In addition, since the doped region 22 is formed by an oblique ion implantation step, the present disclosure can achieve the effect of self-aligned expansion of the doped region.

Figure 15:
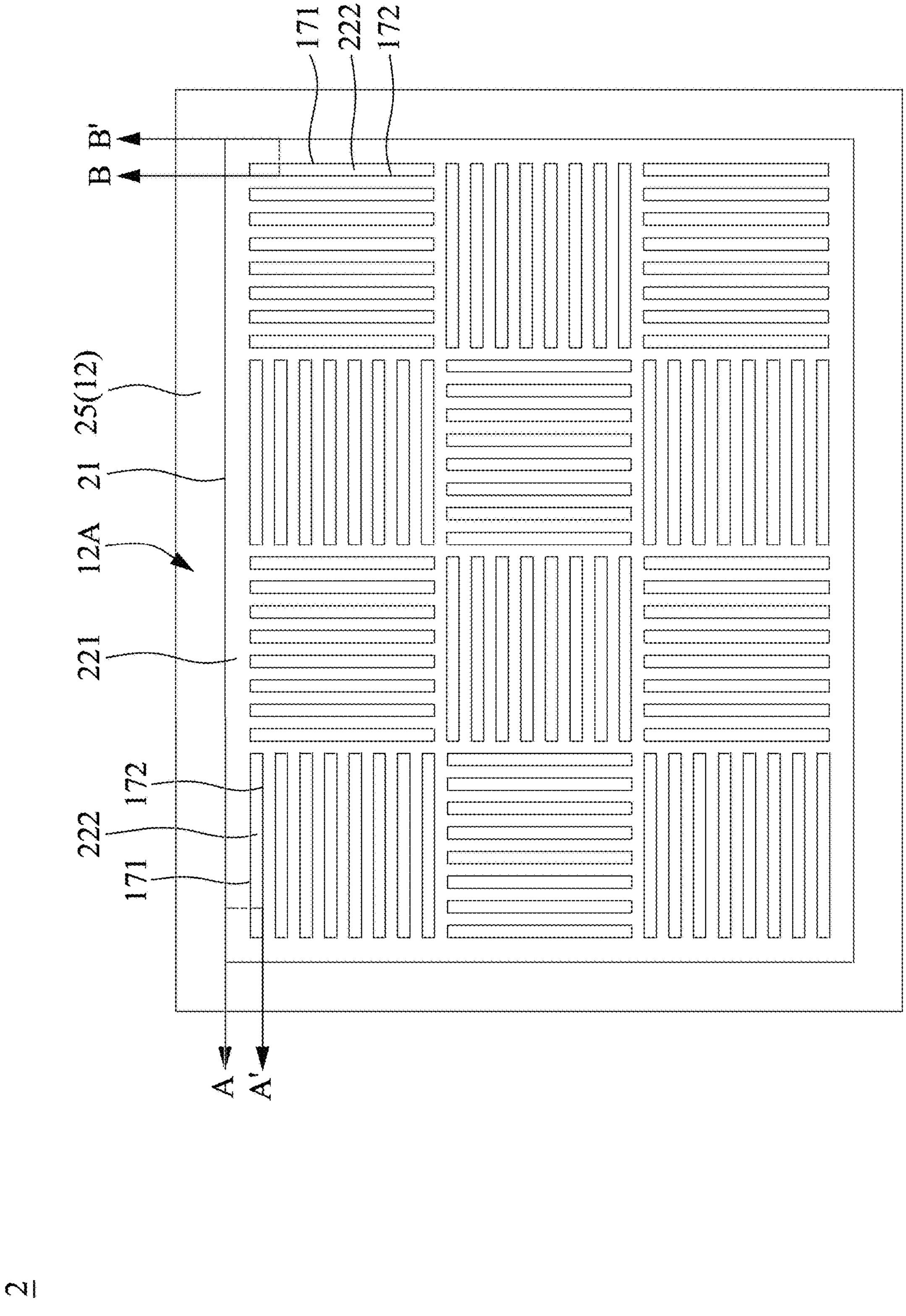
FIGS. 15 and 16 show top views of a semiconductor rectifier devices according to different embodiments of the present case.
Figure 16:
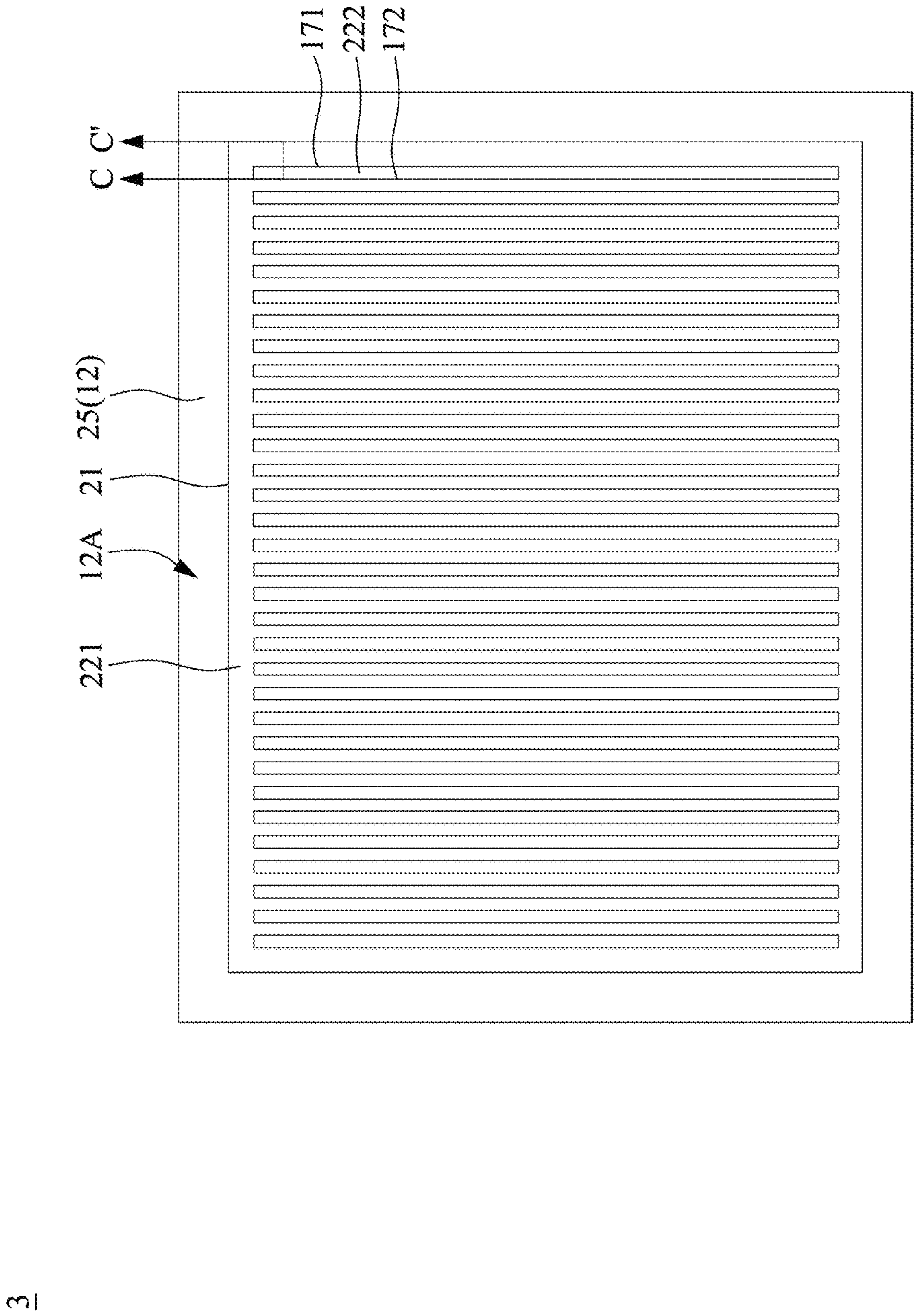

FIGS. 15 and 16 show top views of semiconductor rectifier devices 2 and 3 according to different embodiments of the present case, so as to show different configurations the gate structure 17 can have. It should be noted that the configuration of the gate structure 17 shown in FIGS. 2 and 3 is only for illustration and is not intended to limit the present disclosure.

Referring to FIG. 15, in some embodiments, the gate structure 17 includes a plurality of groups, and the extension directions of gate structures 17 of adjacent groups are perpendicular to each other. In some embodiments, the doped region 21 is of a ring shape, and surrounds all of the gate structures 17. In some embodiments, the gate structures 171 and 172 of FIG. 14 are connected to each other. In some embodiments, the gate structures 171 and 172 belong to two side edges of the same gate structure, wherein the two side edges are opposite to each other and parallel to each other. In some embodiments, FIGS. 1 to 14 are schematic cross-sectional views at a plurality of stages in accordance with cutting line A-A' of FIG. 15. In some embodiments, FIGS. 1 to 14 are schematic cross-sectional views at a plurality of stages in accordance with cutting line B-B' of FIG. 15. In some embodiments, the doped region 25 abuts against the surface 12A, and when looked at from a top view, surrounds the doped region 221.

Referring to FIG. 16, in some embodiments, the gate structure 17 has a plurality of adjacent and parallel gate structures 17. In some embodiments, the doped region 21 is of a ring shape, and surrounds all of the gate structures 17. In some embodiments, the extension direction of the gate structure 17 is parallel to a side edge of the semiconductor rectifier device 3. They are connected to each other. In some embodiments, the gate structures 171 and 172 of FIG. 14 are connected to each other. In some embodiments, the gate structures 171 and 172 belong to two side edges of the same gate structure, wherein the two side edges are opposite to each other and parallel to each other. In some embodiments, FIGS. 1 to 14 are schematic cross-sectional views at a plurality of stages in accordance with cutting line C-C' of FIG. 15. In some embodiments, the doped region 25 abuts against the surface 12A, and when looked at from a top view, surrounds the doped region 221.

According to the described structure and process of the present disclosure, and with the same purpose and concept, the steps in the above-mentioned process can be adjusted or exchanged in sequence, so as to achieve the same or similar vertical power semiconductor devices and semiconductor rectifier devices. FIGS. 17 to 23 show one or more stages in a manufacturing method for a semiconductor rectifier device 4 according to other embodiments of the present case. At least some of these figures have been simplified to facilitate a better understanding of aspects of the present disclosure. In order to simplify the description, only the differences between the processes shown in FIGS. 1 to 14 will be described below, and identical or similar steps will not be repeated.

Figure 17:
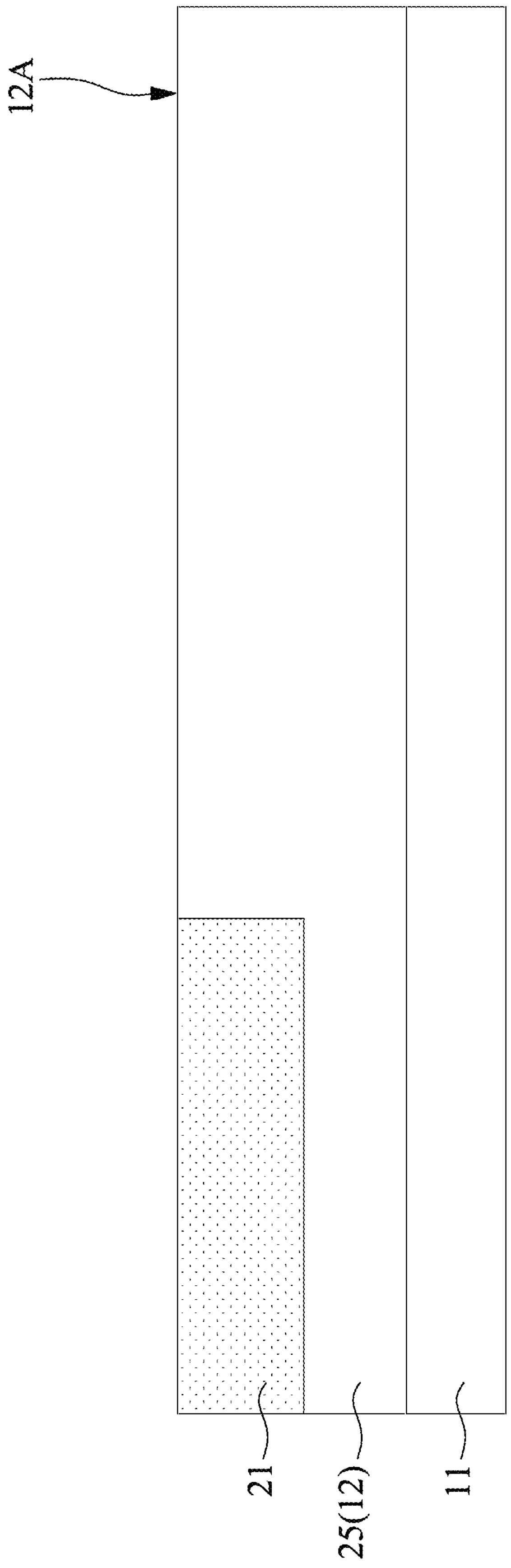
FIGS. 17, 18, 19, 20, 21, 22, and 23 show one or more stages in a manufacturing method for a semiconductor rectifier device according to certain embodiments of the present case.
Figure 18:
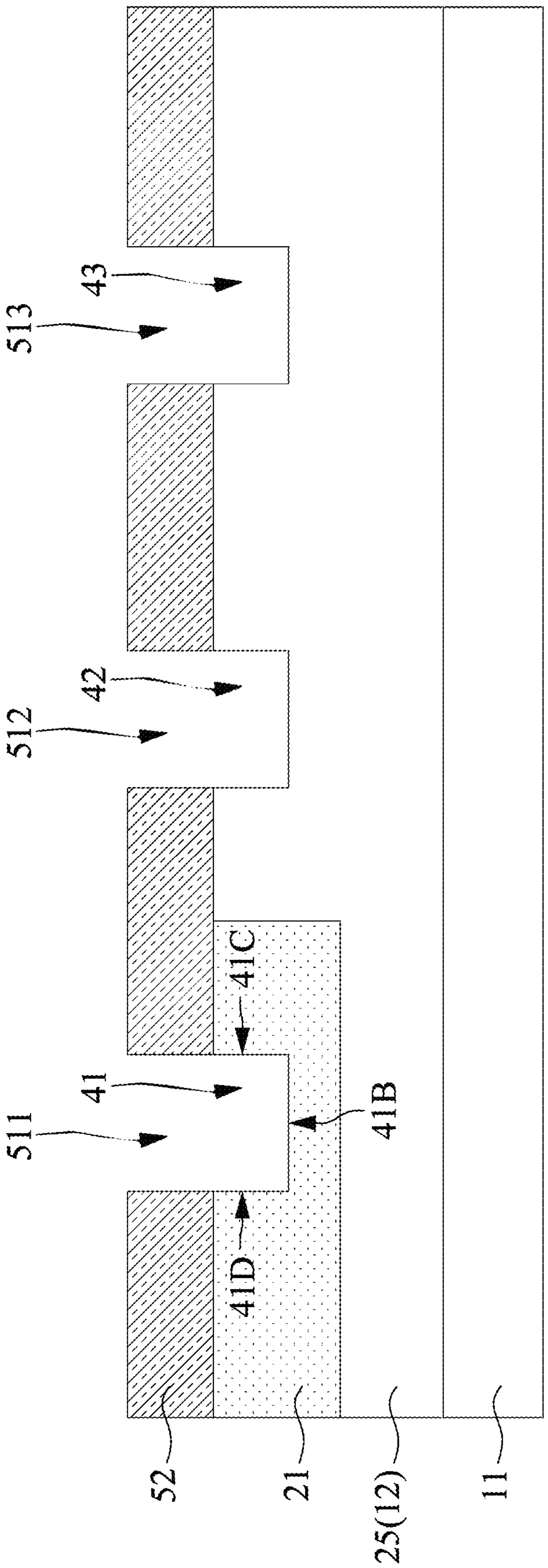

Referring to FIGS. 17 to 18, a plurality of trenches are formed by following the steps of FIGS. 1 to 3, except that in the embodiment of FIG. 18, the plurality of trenches further include a trench 43 that is adjacent to the trench 42, the trench 43 and the trench 41 are located on two opposite sides of the trench, and the trench 41 is formed in the doped region 21. In some embodiments, the patterned layer 51 further includes an opening 513 corresponding to the trench 43. In some embodiments, the patterned layer 51 further includes an opening 513 corresponding to the trench 43. In some embodiments, when looked at from a cross-sectional view, the opening 511 is located within the coverage range of a projection of the doped region 21 along the vertical direction. In some embodiments, when looked at from a cross-sectional view, the side walls 41C and 41D and the bottom surface 41B of the trench 41 abut against the doped region 21.

Figure 19:
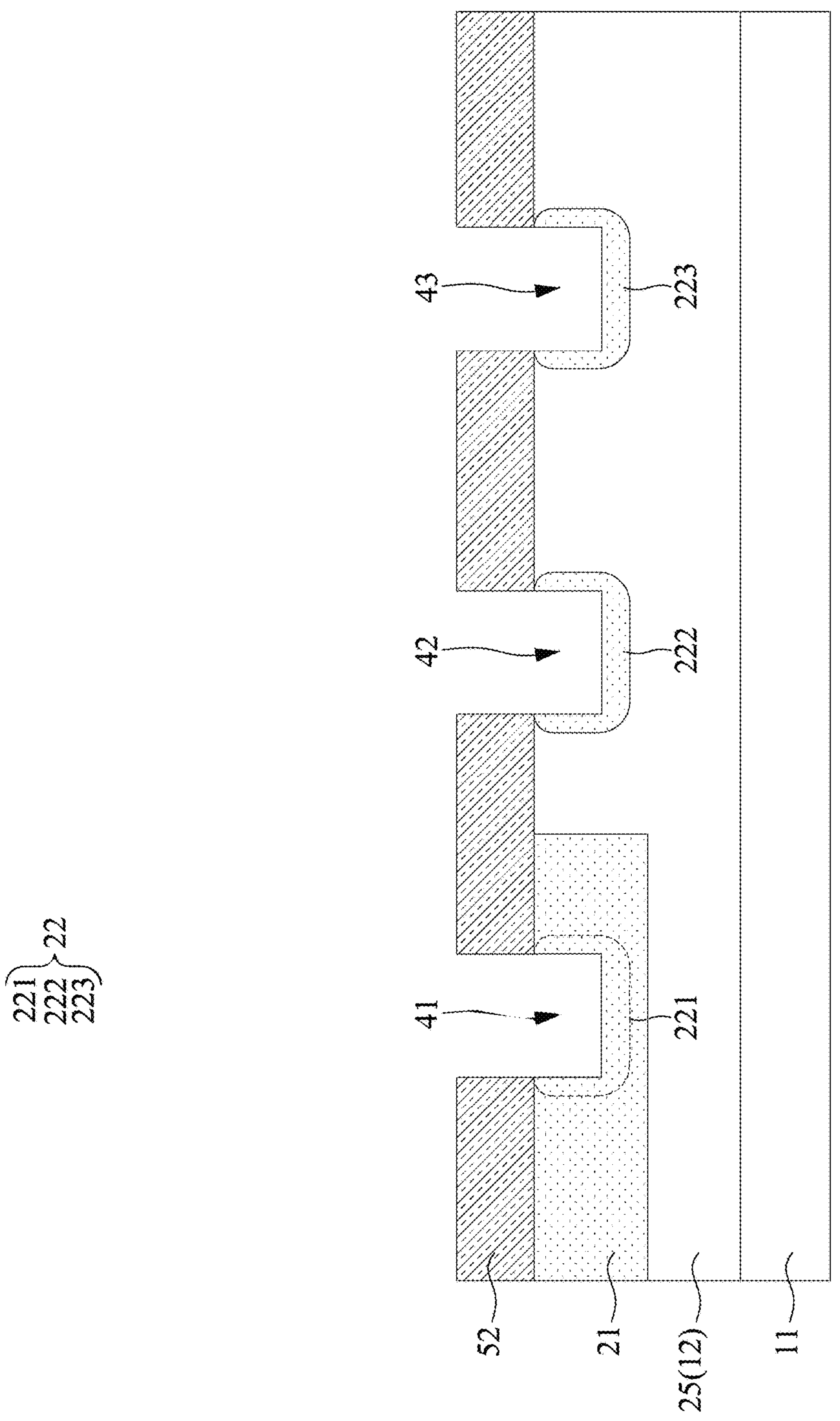

Referring to FIG. 19, a plurality of doped regions 22 are formed by following the steps of FIG. 4, except that in the ion implantation step shown in FIG. 19, since the trench 41 is formed in the range of the silicon carbide layer 12 covered by the doped regions 21, the doped region 221 overlaps with the doped region 21. In other words, a part of the doped region 21 abutting against the side walls 41C and 41D and the bottom surface 41B of the trench 41 is ion implanted simultaneously during the step of forming the doped region 22. In some embodiments, the doped region 221 is formed in the doped region 21. In some embodiments, the doping concentration of the doped region 221 is higher than that of the doped region 21 or other doped regions 22 (e.g., doped regions 222 and 223). After the steps of FIG. 19, the carbon-containing layer can be formed by following the steps of FIG. 5, and then a high-temperature annealing step is performed, and the carbon-containing layer is removed after the high-temperature annealing step.

Figure 20:
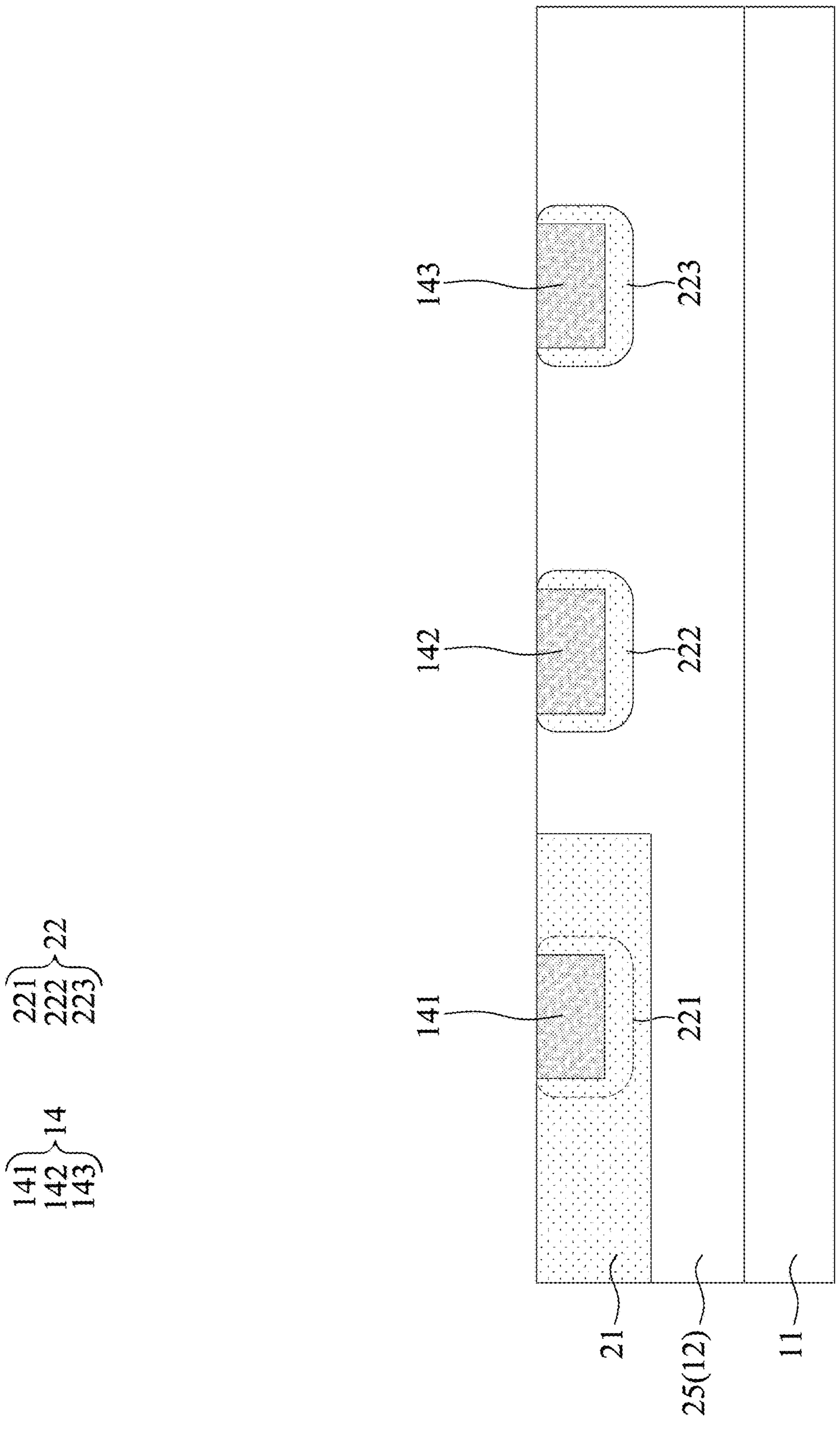

Referring to FIG. 20, the dielectric layer 14 is formed by following the steps of FIG. 7, except that the dielectric layer 14 shown in FIG. 20 further includes a part of a dielectric layer 143 located in the trench 43, and opposite side walls and a bottom surface of a part of the dielectric layer 141 abut against the doped region 221.

Figure 21:
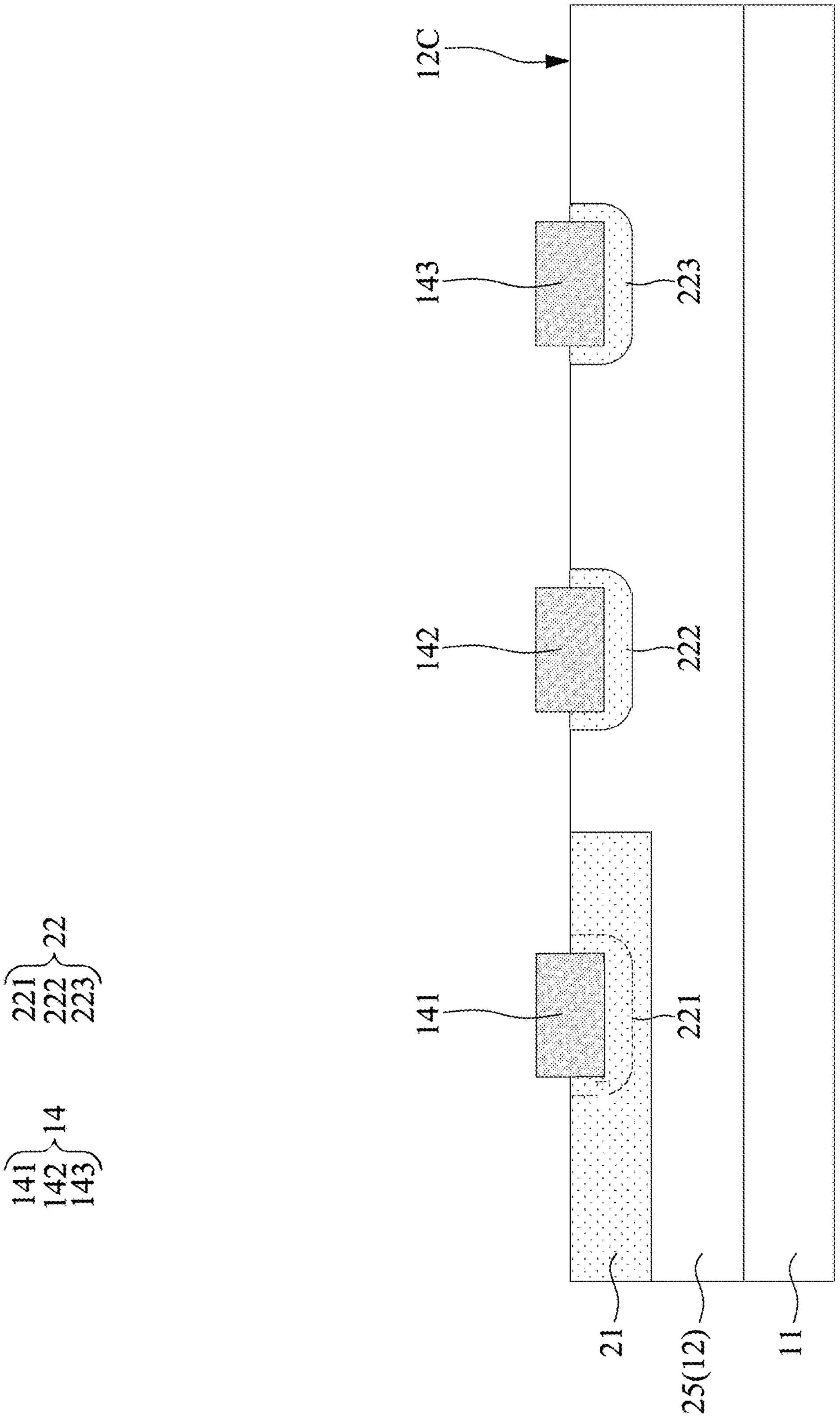

Referring to FIG. 21, a part of the silicon carbide layer 12 adjacent to the surface 12A is removed by following the steps of FIG. 8, except that the silicon carbide layer 12 shown in FIG. 20 is not covered by the dielectric layer 13 of FIG. 8, and the silicon carbide layer 12 therefore does not have both the surface 12A and the surface 12C located at different horizontal heights. In some embodiments, an etching process is performed on all of the surface 12A exposed to the dielectric layer 14. In other words, in some embodiments, the top surface (equivalent to the surface 12C) of the silicon carbide layer 12 after the etching step is lower than the top surface 14A of the dielectric layer 14.

Figure 22:
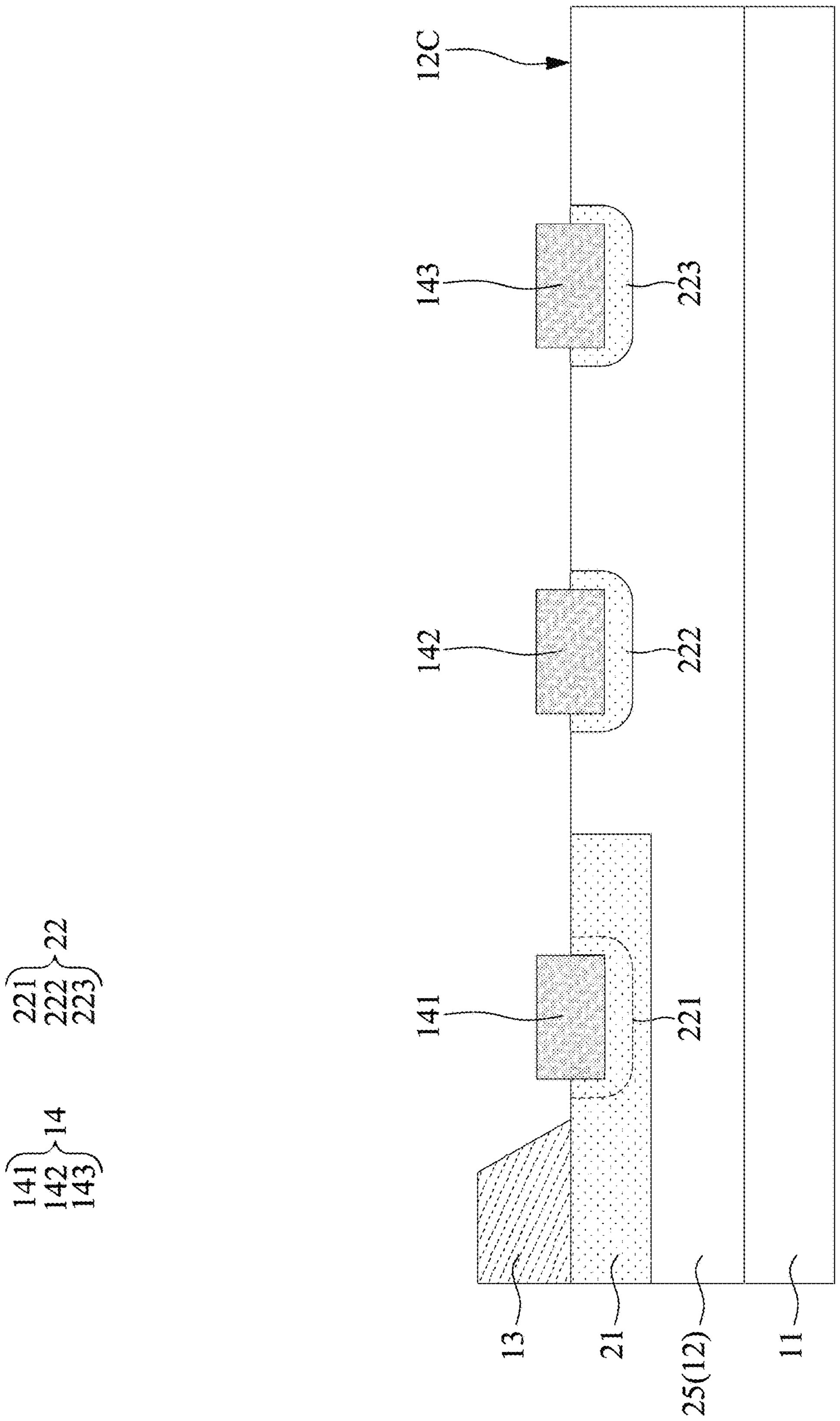

Referring to FIG. 22, the dielectric layer 13 is formed by following the aforementioned steps of FIG. 6, except that the dielectric layer 13 shown in FIG. 20 is located on the surface 12C and does not cover the trench 41. In some embodiments, the dielectric layer 13 and a part of the dielectric layer 141 are separated from each other.

Figure 23:
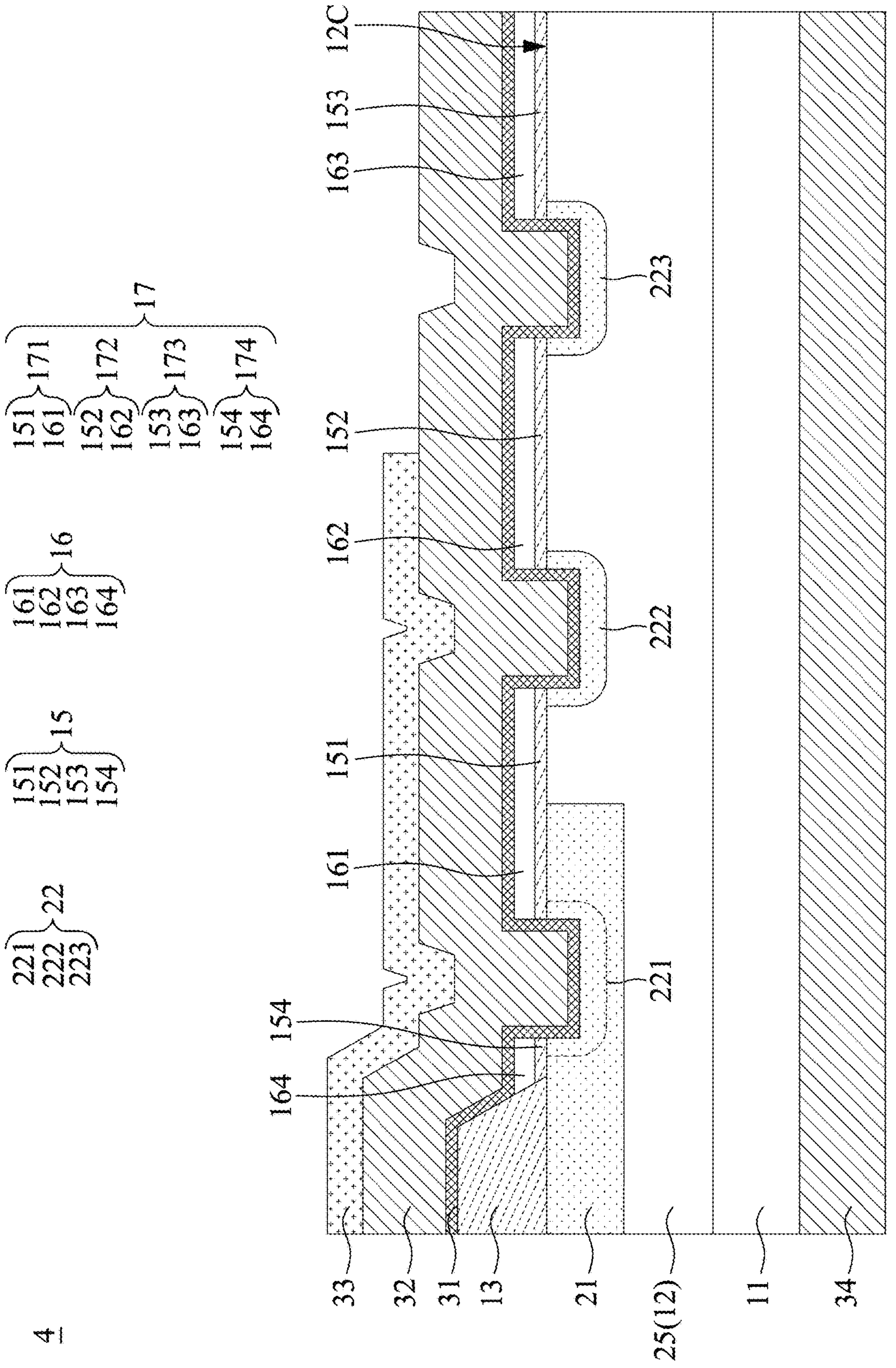

Referring to FIG. 23, the semiconductor rectifier device 4 is formed by following the aforementioned steps of FIGS. 9 to 14, except that the gate structure 17 of FIG. 23 further includes gate structures 173 and 174. In some embodiments, the dielectric layer 15 further includes parts of dielectric layer 153 and 154, wherein the part of the dielectric layer 153 is located on a part of the surface 12C abutting against the trench 43 at the side of the trench 43 opposite to the part of the dielectric layer 153, and the part of the dielectric layer 154 is located on the surface 12C between the trench 41 and the dielectric layer 13. In some embodiments, the gate electrode layer 16 further includes a gate electrode 163 located on a part of the dielectric layer 153 and a gate electrode 164 located on a part of the dielectric layer 154. In some embodiments, the gate structure 173 includes the part of the dielectric layer 153 and a gate electrode 163, and the gate structure 174 includes the part of the dielectric layer 154 and a gate electrode 164. The gate structure 174 abuts against the dielectric layer 13 and does not contribute to the operation and performance of the semiconductor rectifier device 4, and so is also referred to as a virtual gate.

According to the described structure and process of the present disclosure, and with the same purpose and concept, the steps in the aforementioned process can further be adjusted in other manners or exchanged in sequence, so as to achieve the same or similar semiconductor rectifier devices. FIGS. 24 to 30 show one or more stages in a manufacturing method for a semiconductor rectifier device 5 according to other embodiments of the present case. At least some of these figures have been simplified to facilitate a better understanding of aspects of the present disclosure. In order to simplify the description, only the differences from the processes shown in FIGS. 17 to 23 will be described below, and identical or similar steps will not be repeated.

Figure 24:
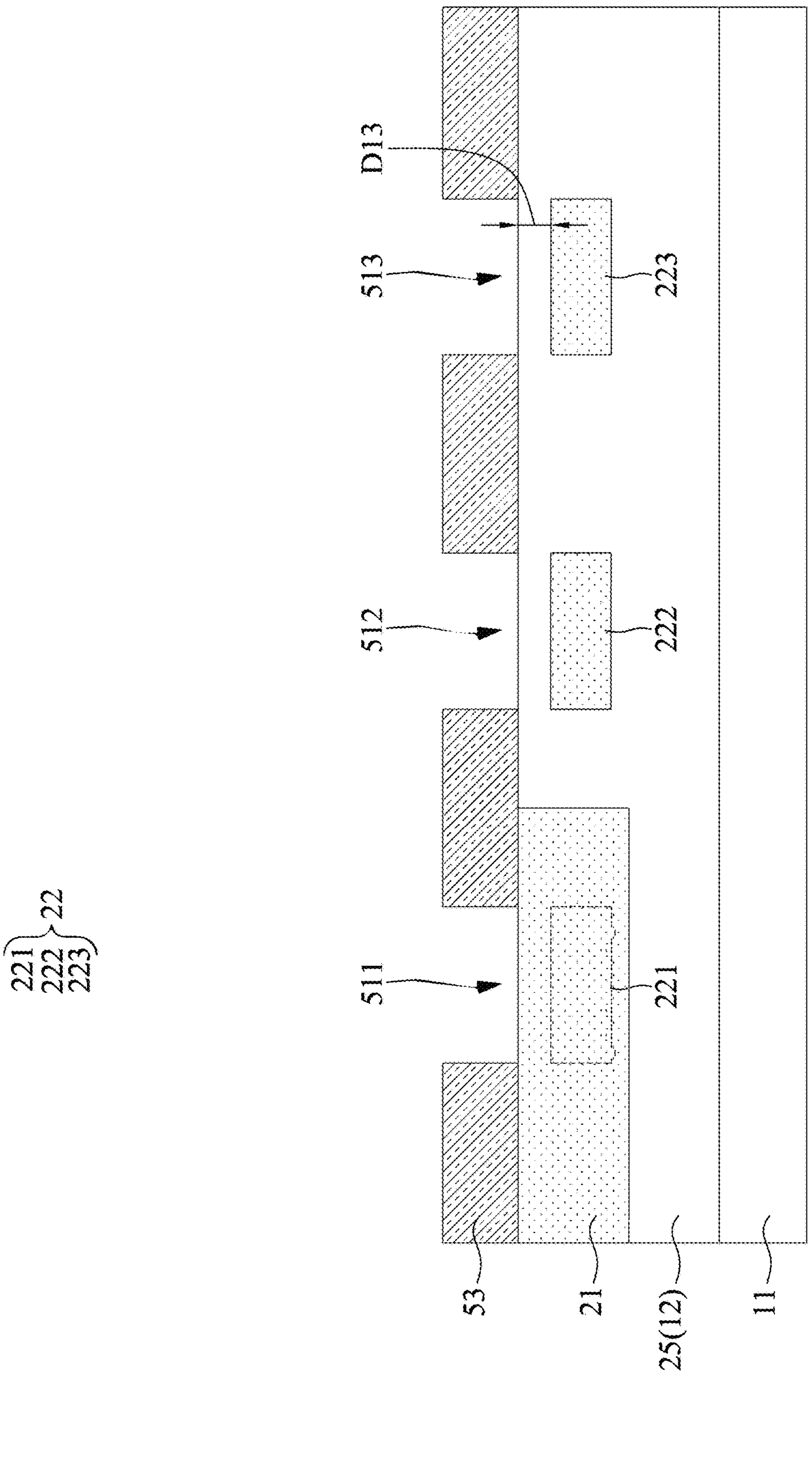
FIGS. 24, 25, 26, 27, 28, 29, and 30 show one or more stages in a manufacturing method for a semiconductor rectifier device according to certain embodiments of the present case.

Referring to FIG. 24, a plurality of doped regions 22 are formed by following the aforementioned steps of FIG. 18, except that in the embodiment of FIG. 24, the ion implantation step is to vertically inject ions into the silicon carbide layer 12. In some embodiments, the step of ion implantation includes vertical ion implantation. In some embodiments, the step of ion implantation does not include oblique ion implantation. By adjusting the parameters of the ion implantation process, a plurality of doped regions 22 formed can be adjusted to be separated from the surface 12A or abut against the surface 12A. In some embodiments, each doped region 22 (including 221, 222 and 223) is separated from the surface 12A, and the vertical distance D13 between each doped region 22 (including 221, 222 and 223) and the surface 12A is between 1000 and 2000 angstroms. In some embodiments, each doped region 22 (including 221, 222 and 223) abuts against the surface 12A (similar to the doped regions 221, 222 and 223 of FIG. 19).

Figure 25:
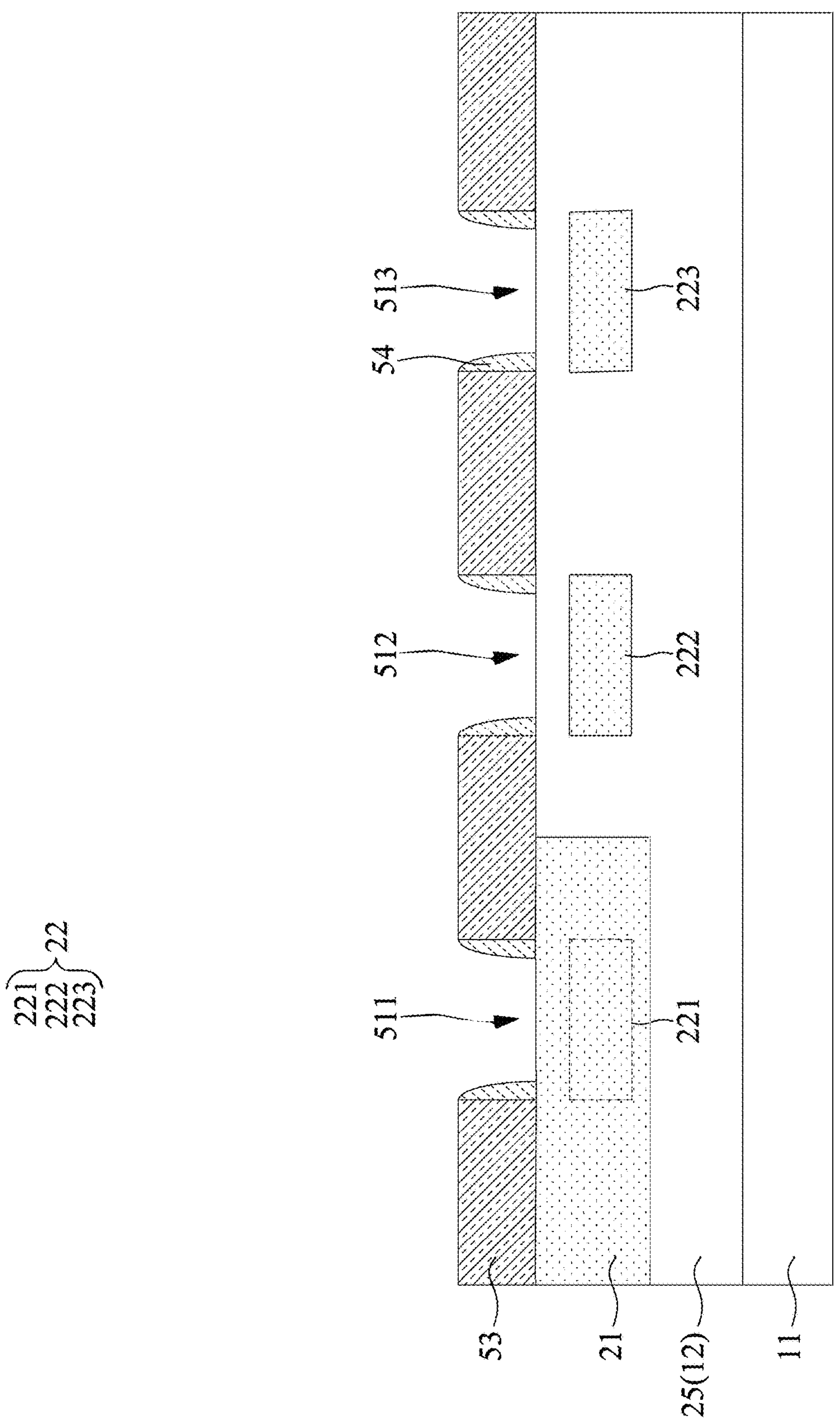

Referring to FIG. 25, the manufacturing method for the semiconductor rectifier device 5 further includes forming side wall spacers 54 on the side walls of the openings 511, 512 and 513 of the patterned layer 53. The formation of the side wall spacers 54 includes, for example, conformally depositing a dielectric material on the patterned layer 53 and the silicon carbide layer 12, and then performing an etching process on the dielectric material to remove a horizontal part of the dielectric material.

Figure 26:
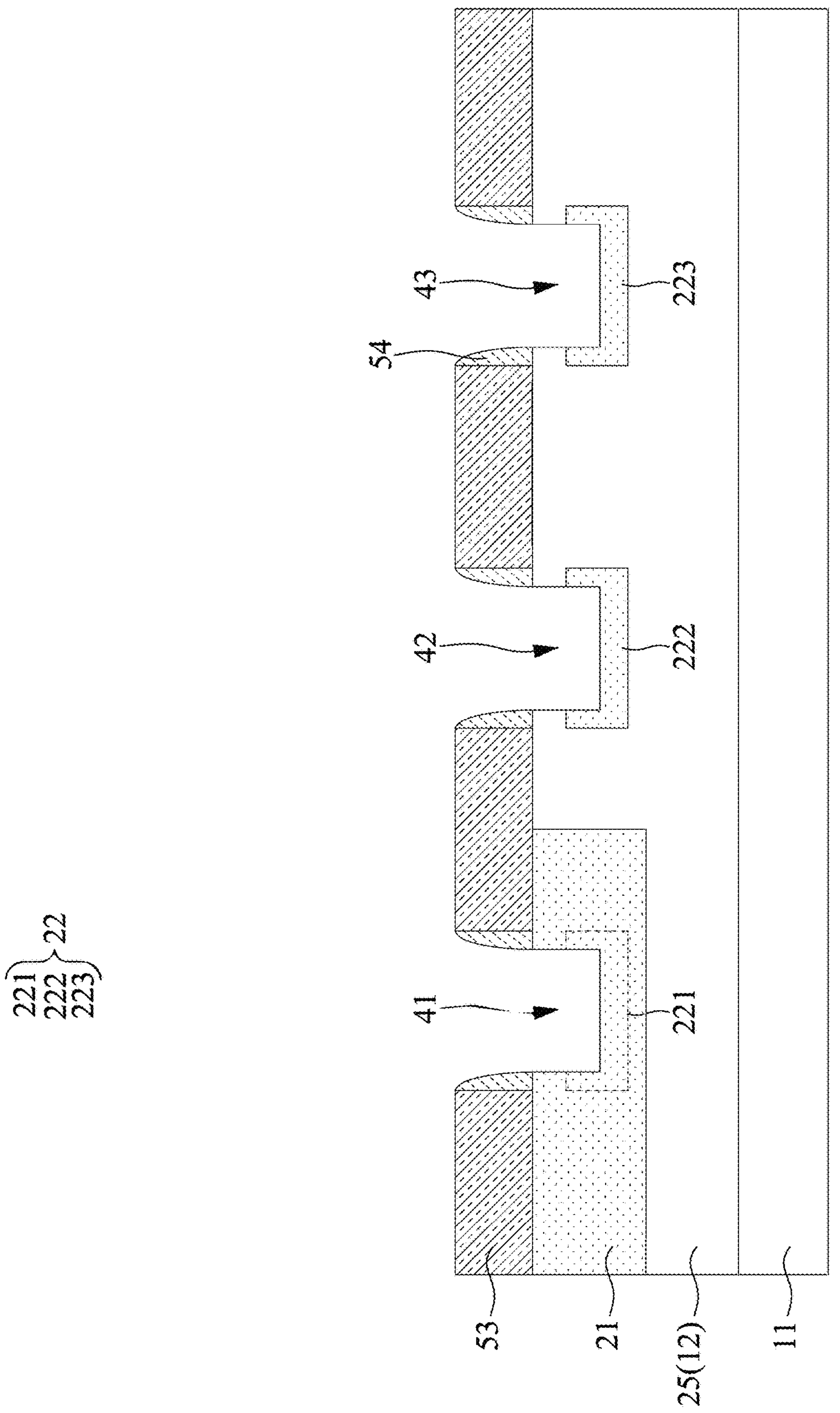

Referring to FIG. 26, a plurality of trenches (including 41, 42 and 43) are formed by following the aforementioned etching steps of FIG. 18 (or FIG. 3), except that in the embodiment of FIG. 26, the silicon carbide layer 12 is etched using the patterned layer 53 and the side wall spacers 54 as a mask. In some embodiments, the width of the trenches 41, 42 and 43 is smaller than the width of the openings 51, 52 and 53, respectively. In some embodiments, the patterned layer 53 and the side wall spacers 54 include the same dielectric material. In some embodiments, the patterned layer 53 and the side wall spacers 54 may be removed simultaneously (or in a single etching step).

Figure 27:
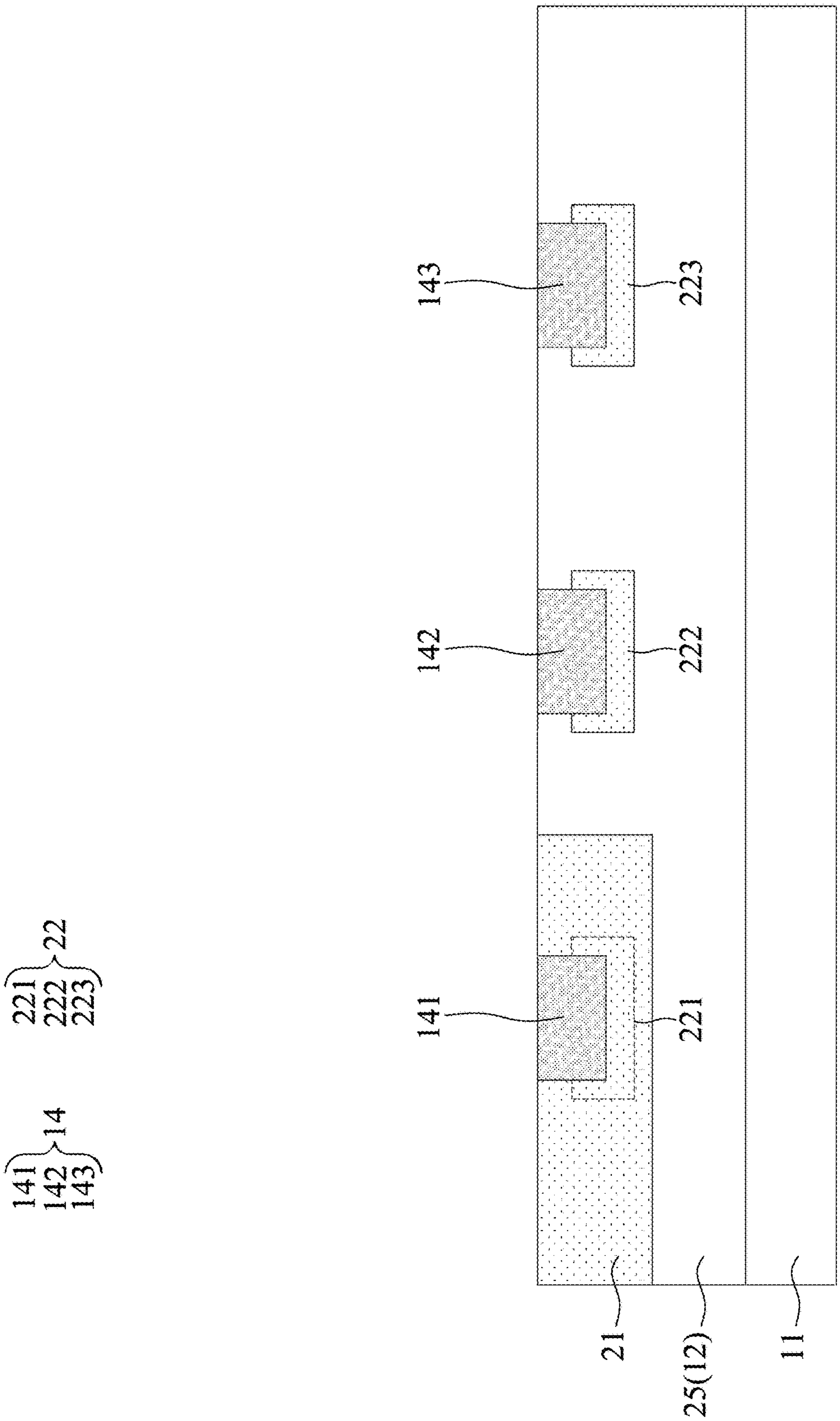
Figure 28:
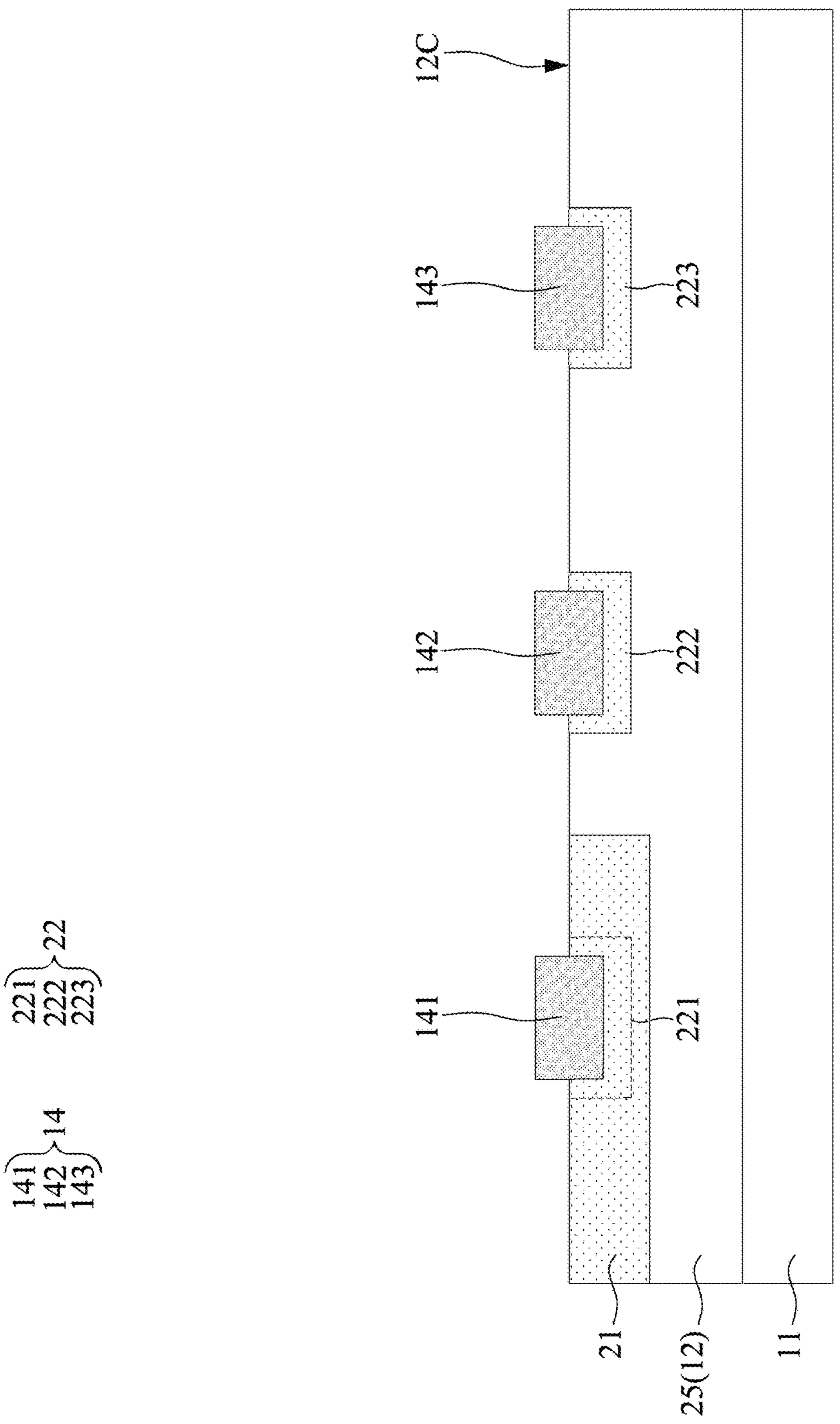
Figure 29:
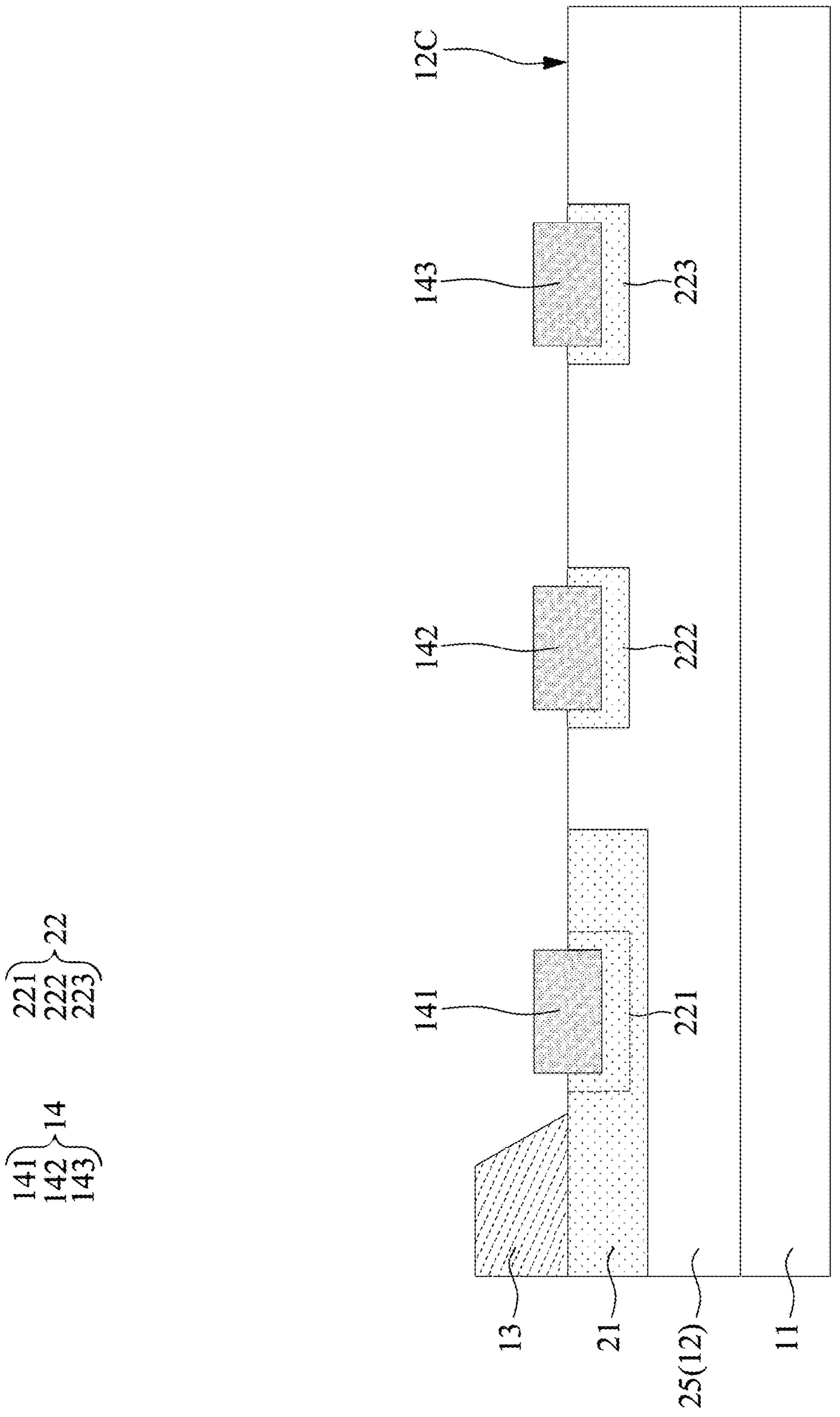
Figure 30:
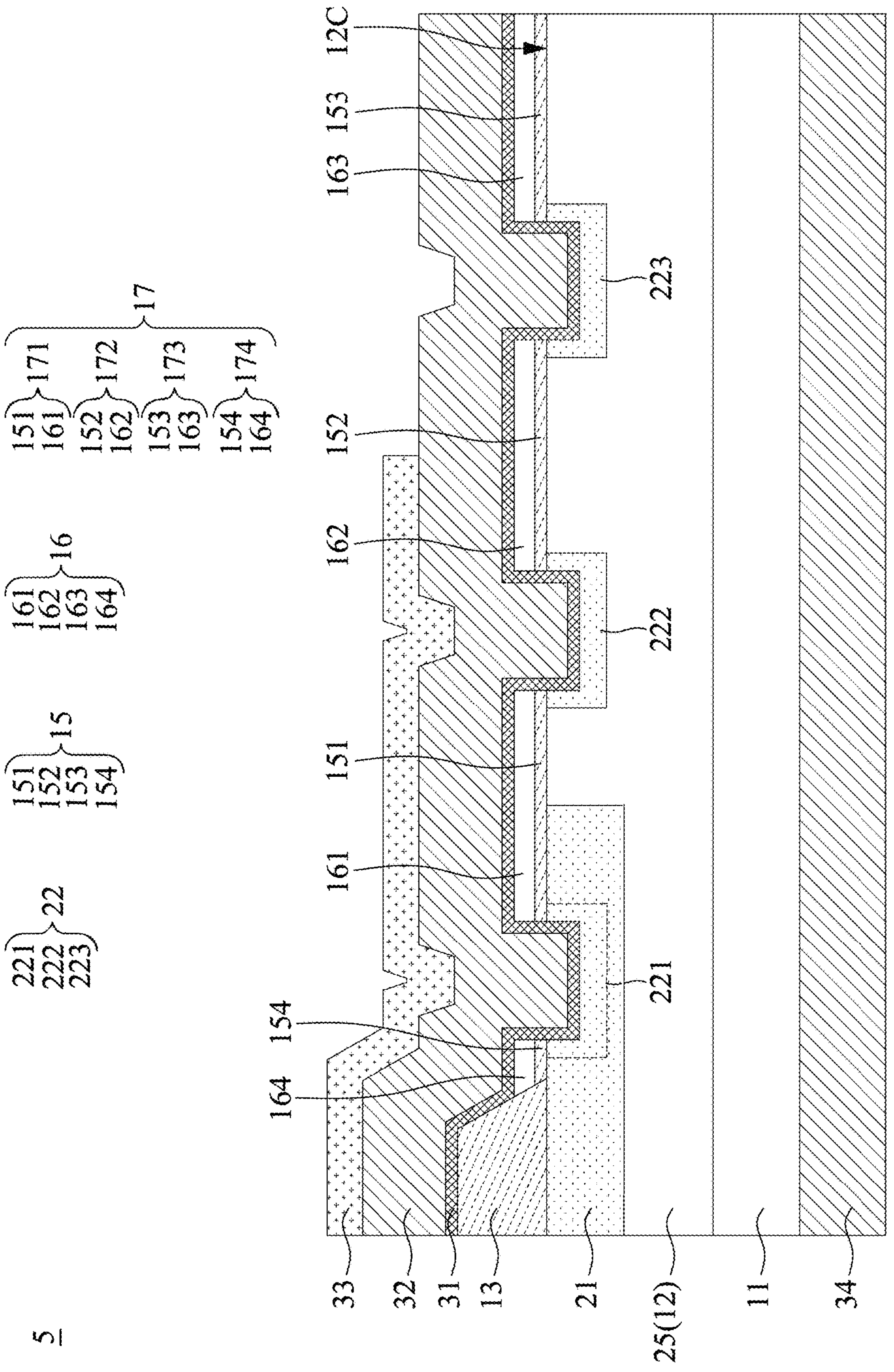

Referring to FIGS. 27 to 30, the semiconductor rectifier device 5 is formed by following the steps of FIGS. 20 to 23, except that since the formation step of the doped region 22 in FIG. 30 does not include oblique ion implantation, the configuration of the doped region 22 of the semiconductor rectifier device 5 may be slightly different from the configuration of the doped regions 22 of the semiconductor rectifier device 4. Furthermore, in some embodiments, since the doped region 22 of the semiconductor rectifier device 5 is separated from the surface 12A (as shown in FIG. 27), the preset thickness of the etching step in FIG. 28 will be controlled to be greater than or equal to the distance D13 shown in FIG. 24, so as to ensure that the plurality of doped regions 221, 222 and 223 (especially 222 and 223) make contact with the surface 12C.

The semiconductor rectifier device 4 and the semiconductor rectifier device 5 formed according to the above methods have a similar structure as that of the semiconductor rectifier device 1, and have the same advantages as the semiconductor rectifier device 1 compared to the prior art, which will not be described again here. Therefore, the semiconductor rectifier device provided by the present disclosure benefits from the material properties of silicon carbide, and can provide reduced power consumption and improve switching efficiency. Moreover, the manufacturing method provided by the present disclosure can effectively integrate a self-alignment process and silicon carbide material, avoiding damage to the gate structure caused by the high-temperature annealing process while reducing overall process costs.

Herein, for convenience of description, spatially relative terms such as "below," "under," "lower," "above," "upper," "left side," and "right side" may be used to describe the relationship between one component or feature and another or more components or features as shown in the accompanying drawings. In addition to the orientation depicted in the accompanying drawings, the spatially relative terms may be intended to encompass different orientations of a device in use or operation. The apparatus may be otherwise oriented (by rotating 90 degrees or at other orientations) and similarly, spatially relative descriptors used herein may be interpreted in a corresponding manner. It should be understood that when a component is referred to as "connected to" or "coupled to" another component, said component may be directly connected to or coupled to another component, or an intermediate component may be present.

As used herein, the terms "approximately," "substantially," "essentially," and "about" are used to describe and interpret small variations. When used in conjunction with an event or circumstance, the terms can refer to instances where the event or circumstance occurs exactly as well as instances where the event or circumstance occurs nearly. As used herein with respect to a given value or range, the term "about" refers generally to within ±10%, ±5%, ±1%, or ±0.5% of a given value or range. The range may be expressed herein as one endpoint to another endpoint or between two endpoints. All ranges disclosed herein include endpoints unless otherwise specified. The term "substantially coplanar" may refer to the difference in position of two surfaces located along the same plane being within several microns (μm), such as a position difference located along the same plane being within 10 μm, 5 μm, 1 μm or 0.5 μm. When values or properties are referred to as being "substantially" identical, the term may refer to values that are within ±10%, ±5%, ±1%, or ±0.5% of the mean value of the stated values.

The foregoing summarizes the features of several embodiments and the detailed aspects of the present disclosure. The embodiments described in the present disclosure may be readily used as a basis for designing or modifying other processes and structures to facilitate implementation of the same or similar purpose and/or achieve the same or similar advantages of the embodiments introduced herein. Such equivalents do not depart from the spirit and scope of the present disclosure, and various changes, replacements and alterations may be made without departing from the spirit and scope of the present disclosure.

What is claimed is:

1. A semiconductor rectifier device comprising:

an epitaxial layer having a top surface and a bottom surface that are opposite to each other;

a first trench extending from the top surface to the bottom surface, the first trench comprising a first side wall, a second side wall opposite to the first side wall, and a first bottom surface connecting the first side wall and the second side wall;

a second trench extending from the top surface to the bottom surface and being adjacent to the first trench, the second trench comprising a third side wall, a fourth side wall opposite to the third side wall, and a second bottom surface connecting the third side wall and the fourth side wall;

a first doped region extending from the top surface to the bottom surface and abutting against the first side wall and at least a part of the first bottom surface of the first trench;

a second doped region adjacent to and separated from the first doped region, wherein the second doped region extends from the top surface to the bottom surface, and abuts against the third side wall, the fourth side wall and the second bottom surface of the second trench;

a gate structure disposed on the top surface between the first trench and the second trench, wherein a bottom surface of the gate structure abuts against the first doped region and the second doped region; and a contact metal layer disposed on the top surface of the epitaxial layer along the first trench, the gate structure, and the second trench.

2. The semiconductor rectifier device according to claim 1, wherein the gate structure comprises a fifth side wall and a sixth side wall opposite to the fifth side wall, wherein the fifth side wall is aligned with the second side wall of the first trench when viewed from a cross-sectional view, and the sixth side wall of the gate structure is aligned with the third side wall of the second trench when viewed from the cross-sectional view.

3. The semiconductor rectifier device according to claim 1, wherein the first side wall of the first trench is connected to a first part of the top surface, a part of the top surface between the first trench and the second trench is a second part of the top surface, and the first part and the second part are located at an approximately same horizontal height.

4. The semiconductor rectifier device according to claim 1, wherein the first side wall of the first trench is connected to a first part of the top surface, a part of the top surface between the first trench and the second trench is a second part of the top surface, and the first part has a first horizontal height, the second part has a second horizontal height lower than the first horizontal height.

5. The semiconductor rectifier device according to claim 1, further comprising:

a third doped region extending from the top surface to the bottom surface and overlapping with at least a part of the first doped region, the third doped region having a depth 4 greater than a depth of the first doped region.

6. The semiconductor rectifier device according to claim 5, wherein a part of the third doped region close to the first doped region has a higher doping concentration.

7. The semiconductor rectifier device according to claim 1, wherein the contact metal layer is in contact with the second side wall of the first trench, the bottom surface of the first trench, the third side wall and the fourth side wall of the second trench, and the bottom surface of the second trench.

8. The semiconductor rectifier device according to claim 1, wherein the first doped region further abuts against the first side wall of the first trench.

9. The semiconductor rectifier device according to claim 1, wherein a first height of the first side wall of the first trench is greater than a second height of the second side wall of the first trench, a third height of the third side wall of the second trench is approximately equal to a fourth height of the fourth side wall of the second trench, and the second height, the third height, and the fourth height are approximately equal.

* * * * *